United States Patent
Hanya

(10) Patent No.: US 7,692,208 B2
(45) Date of Patent: Apr. 6, 2010

(54) SEMICONDUCTOR OPTICAL DEVICE

(75) Inventor: Akihiko Hanya, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 523 days.

(21) Appl. No.: 11/739,861

(22) Filed: Apr. 25, 2007

(65) Prior Publication Data

US 2007/0284708 A1 Dec. 13, 2007

(30) Foreign Application Priority Data

May 18, 2006 (JP) .............................. 2006-139095

(51) Int. Cl.
*H01L 33/00* (2010.01)
(52) U.S. Cl. .............................. 257/100; 257/E23.048; 257/88; 257/90; 257/98; 257/433; 438/21
(58) Field of Classification Search .......... 257/E23.031, 257/E25.02, E23.048, 676, 680, 98–100, 257/90, 88, 432–434; 438/21, 29; 362/231, 362/240; 174/259; 348/340
See application file for complete search history.

(56) References Cited

U.S. PATENT DOCUMENTS

| | | | | |
|---|---|---|---|---|
| 5,508,557 | A * | 4/1996 | Sunada ........................ | 257/692 |
| 6,483,623 | B1 * | 11/2002 | Maruyama ................... | 398/182 |
| 6,516,516 | B1 * | 2/2003 | Lee .............................. | 29/855 |
| D505,396 | S * | 5/2005 | Hoshiba ...................... | D13/180 |
| 6,995,510 | B2 * | 2/2006 | Murakami et al. ........... | 313/512 |
| 7,161,190 | B2 * | 1/2007 | Chikugawa ................... | 257/99 |
| 7,282,785 | B2 * | 10/2007 | Yoshida ....................... | 257/666 |
| D557,224 | S * | 12/2007 | Kamada ...................... | D13/180 |
| 7,312,479 | B2 * | 12/2007 | Fujii ............................ | 257/100 |
| D597,972 | S * | 8/2009 | Kobayakawa .............. | D13/180 |
| 2007/0284708 | A1 * | 12/2007 | Hanya ......................... | 257/676 |

FOREIGN PATENT DOCUMENTS

JP 2004193537 7/2004

* cited by examiner

*Primary Examiner*—Chris C Chu
(74) *Attorney, Agent, or Firm*—Cermak Kenealy Vaidya & Nakajima LLP

(57) ABSTRACT

The disclosed subject matter includes a semiconductor optical device with a stable optical characteristic, an excellent radiant efficiency, and a high mounting reliability. A casing can be configured with a concaved-shaped cavity that includes an opening and a bottom portion. Each of one end portions of first/second lead frame electrodes 3a, 3b can be exposed on the bottom portion. The first one end portion can include an optical chip mounted thereon, and the second one end portion can be connected to another electrode of the optical chip via a bonding wire. The first lead frame electrode extends from an outside surface substantially perpendicular to the bottom portion and is bent in a direction towards the opening. The second lead frame electrode extends from an outside surface of the casing that is opposite to the outside surface from which the first electrode extends. Various physical configurations of the electrodes are disclosed.

34 Claims, 15 Drawing Sheets

Fi.3.(a)

SEMICONDUCTOR OPTICAL DEVICE

This application claims the priority benefit under 35 U.S.C. §119 of Japanese Patent Application No. 2006-139095 filed on May 18, 2006, which is hereby incorporated in its entirety by reference.

BACKGROUND

1. Field

The presently disclosed subject matter relates to a semiconductor optical device including LEDs, laser diodes, photodiodes, etc. and more particularly to a surface mount semiconductor optical device, which emits/detects light in parallel with a mounting surface thereof (e.g., a side view type semiconductor device).

2. Description of the Related Art

A surface mount semiconductor optical device having a semiconductor optical chip mounted in a casing that is provided with lead frame electrodes insert-formed by a resin includes the following two types. One is a top view type, in which a light ray axis is perpendicular to a circuit board on which the chip is mounted. The other is a side view type, in which a light ray axis is parallel to the circuit board.

A semiconductor optical device of the side view type is generally used as a light source for use with a light guide material in a flat panel display, which is used as a back light unit for a LCD panel, a panel lighting apparatus, general lighting and the like.

The structure shown in FIG. 16 is a typical structure for a conventional semiconductor optical device 52 of the side view type. The structure includes a casing 51 that is provided with lead frame electrodes 50(*a*), 50(*c*), 50(*b*), 50(*d*) insert-formed by a resin. The casing 51 includes a concave-shaped cavity with an opening and a bottom portion at which each end portion 50*a*, 50*b* of the lead frame electrodes that are respectively separated is exposed. Each other end portion 50*c*, 50*d* is bent forwards and backwards towards or parallel with an optical or light ray axis of the semiconductor optical device 52. The other end portions 50*c*, 50*d* extend outside the bottom surface at the same level as the bottom portion by extending from the bottom portion to an area outside of the casing 51.

An LED chip 53 is mounted on the exposed end portion 50*a* via a conductive material and is electrically connected at one electrode thereof to the exposed end portion 50*a*. The other electrode of the LED chip 53 is electrically connected to the exposed end portion 50*b* via a bonding wire 54. An encapsulating transparent resin is disposed in the concave-shaped cavity for encapsulating chips 53 and bonding wires 54. A semiconductor optical device such as a surface mount LED device of the side view type is described in further detail, for example, in Japanese Patent Application Laid Open JP2004-193537 and its English translation, which are hereby incorporated in their entirety by reference.

Because an LED chip used for the above-described conventional semiconductor optical device is made from semiconductor materials, the electrical and optical characteristics thereof are dependent on temperature. That is, when a current flows to an LED chip and the LED chip is lit, a light-emitting efficiency thereof decreases due to a self-fever condition caused by an LED current that flows into the LED chip and elevates the temperature of the MED chip.

Thus, in order to prevent the decrease of the light-emitting efficiency one can radiate the self-fever, which is generated during light-emitting of the LED chip. The self-fever generated in an LED chip may be generally radiated from an LED chip to an area outside of the semiconductor optical device through the lead frame electrodes that include an LED chip mounted thereon. The lead frame electrodes may greatly contribute to the prevention of the self-fever condition in an LED chip both directly and indirectly. Therefore, effective radiation characteristic design for the lead frame electrode is an important factor for preventing a rise of the self-fever during light-emitting of the LED chip.

When the above-described conventional semiconductor optical device 52 is considered, both the one lead frame electrode mounted an LED chip on the exposed one end portion thereof and the other lead frame electrode connected to the exposed end portion thereof via a bonding wire extend into the same surface of the concave-shaped cavity to and from the same outside surface.

In a surface mount semiconductor optical device that is miniaturized, the greater the amount of lead frame electrodes that lead from the casing to the outside, the narrower the width of each lead frame electrode is in order to maintain a miniaturization of the device size.

However, the narrower the width of the lead frame electrode, the smaller the cross-sectional area that is perpendicular to current flow direction in the LED becomes. As a result, a thermal conduction decrease of the lead frame electrode is caused by an increase of thermal resistance, and may result in a loss of radiation ability.

The lead frame electrode is generally formed by stamping out a sheet metal using a press die. Each interval in the sheet metal between respective adjacent lead frame electrodes should at least be wider than a thickness of the lead frame electrode by restriction of the pressing process. Thus, the increase in the number of lead frame electrodes results in a restrictive factor for designing a miniaturization of a semiconductor optical device size.

If the number of lead frame electrodes increases, each area at the other end portions of lead frame electrodes that leads from the casing should be small due to a layout restriction, e.g., for maintaining a predetermined interval between respective adjacent lead frame electrodes. When the semiconductor optical device is mounted on a circuit board, the function of the other end portions includes: fixing the device to the circuit board by mounting on conductor patterns of a circuit board; electrically connecting the device to a circuit board; and conducting the self-fever of LED chips to conductor patterns of a circuit board through the lead frame electrodes upon which LED chips are mounted.

If the area of respective other end portions of the lead frame electrodes becomes small, the contact area with conductor patterns of a circuit board becomes small. Thus, the decrease in area of respective other end portions may result in a decrease of mounting reliability because the semiconductor optical device may not be mounted with strength and confidence by the respective other end portions, and may result in a decrease of the light-emitting efficiency due to a rise of the operating temperature of an LED chip by weakening radiating efficiency of the LED chip's self-fever.

Furthermore, when a complex light-emitting color is emitted by a plurality of different light-emitting color LED chips, it is difficult to maintain a miniaturization of a semiconductor optical device size and to provide equal spacing intervals for the respective adjacent LED chips due to layout restrictions of the lead frame electrodes when positions of the one end portions must be moved in accordance with a layout of LED chips. If each interval of the respective adjacent LED chips is forced to be equal, a semiconductor optical device may become large and may result in a decrease in the color rendering index because of long intervals between respective adjacent LED chips.

The disclosed subject matter has been devised in consideration of the above and other problems and characteristics. The disclosed subject matter can include a semiconductor optical device, which includes a stable optical characteristic with an excellent radiant efficiency, a high mounting reliability, and a possibility for design miniaturization.

SUMMARY OF THE DISCLOSED SUBJECT MATTER

The presently disclosed subject matter has been devised in view of the above and other characteristics problems and features and includes a semiconductor optical device with high mounting reliability and the possibility of miniaturization. Another aspect of the disclosed subject matter includes a semiconductor light-emitting device that emits various light-emitting colors with excellent optical characteristics.

According to an aspect of the disclosed subject matter, a semiconductor optical devices can include: a casing formed substantially cuboid by a resin, the casing having a concave-shaped cavity with an opening and a bottom portion; at least one first lead frame electrode with one end portion thereof disclosed on the bottom portion, the at least one first lead frame electrode being led onto either outside surface that is substantially perpendicular to the bottom portion and being bent substantially perpendicular at the outside surface in the direction of the opening; at least one second lead frame electrode corresponding to the at least one first electrode, with one end portion thereof disclosed on the bottom portion, the at least one second lead frame electrode being led onto an outside surface opposite to the outside surface whereon the at least one first lead frame electrode is led and/or being led onto at least one outside surface that is substantially perpendicular to the outside surface whereon the at least one first lead frame electrode is led, being bent substantially perpendicular at the respective outside surfaces in the direction of the opposite side of the opening and other end portion thereof being led to the substantially same level as the at least one first lead frame electrode; and at least one semiconductor optical chip being mounted on the one end portion of the at least one first lead frame electrode, one electrode thereof being electrically connected to the one end portion of the at least one first lead frame electrode, and other electrode thereof being electrically connected to the other end portion of the corresponding at least one second lead frame electrode of the at least one first lead frame electrode.

In the immediate above described exemplary semiconductor optical devices, the at least one second lead frame electrode may be further bent substantially perpendicular in the direction of the other end portion of the at least one first lead frame electrode or may be further bent substantially perpendicular in the direction opposite to the other end portion of the at least one first lead frame electrode.

According to an modifiable aspect of the disclosed subject matter, semiconductor optical devices can include: a casing formed substantially cuboid by a resin, the casing having a concave-shaped cavity with an opening and a bottom portion; at least one first lead frame electrode with one end portion thereof disclosed on the bottom portion, the at least one first lead frame electrode being led onto either outside surface that is substantially perpendicular to the bottom portion and being bent substantially perpendicular at the outside surface in the direction opposite to the opening; at least one second lead frame electrode corresponding to the at least one first lead frame electrode, with one end portion thereof disclosed on the bottom portion, the at least one second lead frame electrode being led onto a outside surface opposite to the outside surface whereon the at least one first lead frame electrode is led and/or being led onto at least one outside surface that is substantially perpendicular to the outside surface whereon the at least one first lead frame electrode is led, being bent substantially perpendicular at the respective outside surfaces in the direction of the opening and other end thereof being led to the substantially same level as the at least one first lead frame electrode; and at least one semiconductor optical chip being mounted on the one end portion of the at least one first lead frame electrode, one electrode thereof being electrically connected to the one end portion of the at least one first lead frame electrode, and other electrode thereof being electrically connected to the other end portion of the corresponding at least one second lead frame electrode of the at least one first lead frame electrode.

In the above described exemplary optical devices, the at least one second lead frame electrode may be further bent substantially perpendicular onto the outside surface whereon the at least one first lead frame electrode is led.

In the above described exemplary semiconductor optical devices, the at least one first lead frame electrode may be further led onto an outside surface substantially perpendicular to the outside surface whereon the at least one first lead frame electrode is led.

In the above described exemplary semiconductor optical devices, each of the first lead frame electrodes may be bent in the opposite direction of each adjacent first lead frame electrode among these first lead frame electrodes that are led from the bottom portion of the concave-shaped cavity to either outside surface of the casing.

Another of the aspects of the disclosed subject matter includes semiconductor optical devices that can include: an encapsulating resin made of at least one of a transparent resin and a mixture resin that includes a resin mixed with at least one of a diffuser, a phosphor, and a pigment for selectively absorbing light having a predetermined wavelength can be disposed in the concave-shaped cavity; and at least one semiconductor light-emitting chip that is configured as a semiconductor optical chip.

BRIEF DESCRIPTION OF THE DRAWINGS

These and other characteristics and features of the disclosed subject matter will become clear from the following description with reference to the accompanying drawings, wherein:

FIG. 3(a)-(d) are a front view, a top view, a side view and a bottom view for a second exemplary embodiment of a semiconductor optical device made in accordance with principles of the disclosed subject matter;

DETAILED DESCRIPTION OF EXEMPLARY EMBODIMENTS

Figure 1:
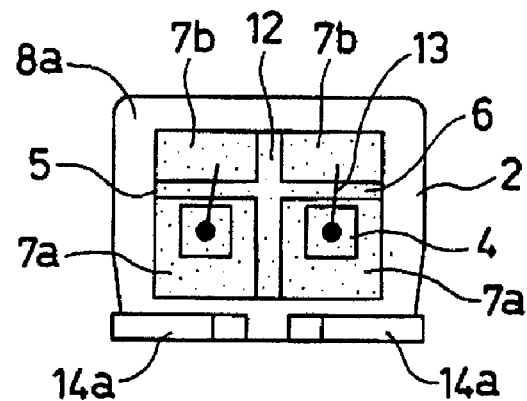
FIGS. 1(a)-(d) are a front view, a top view, a side view and a bottom view in turn for a first embodiment of a semiconductor optical device made in accordance with principles of the disclosed subject matter.
Figure 1:
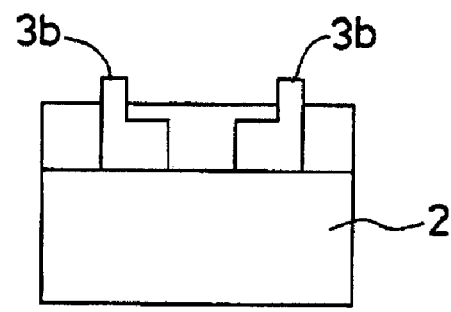
Figure 1C:
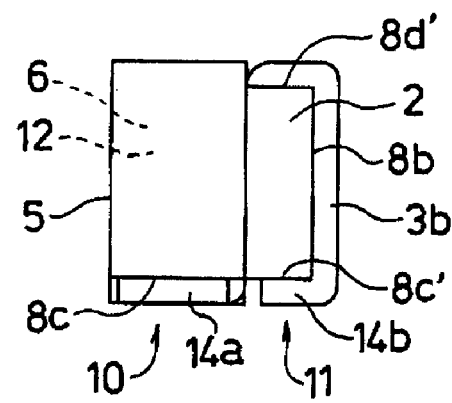
Figure 1D:
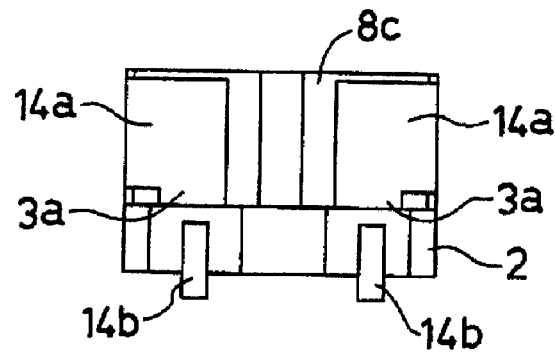
Figure 2:
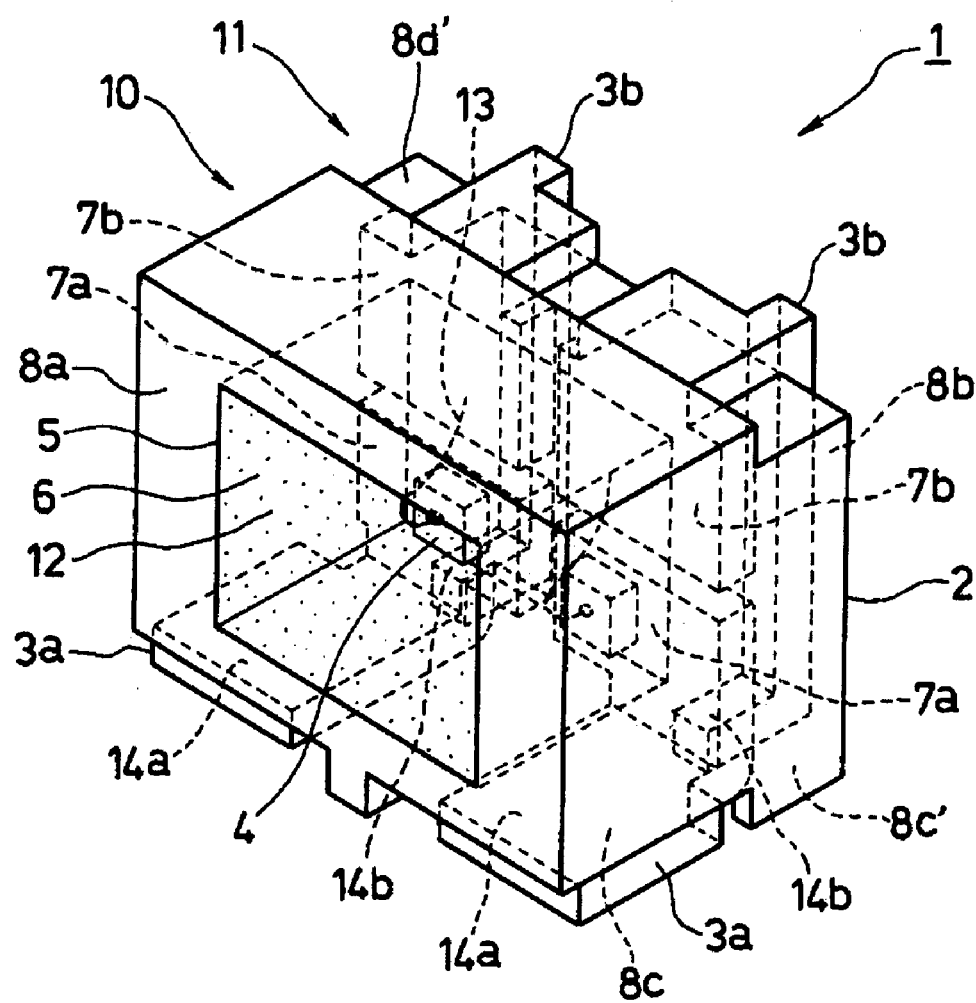
FIG. 2 is a perspective view for the semiconductor optical device according to the first exemplary embodiment of FIGS. 1(a)-(d)
Figure 3B:
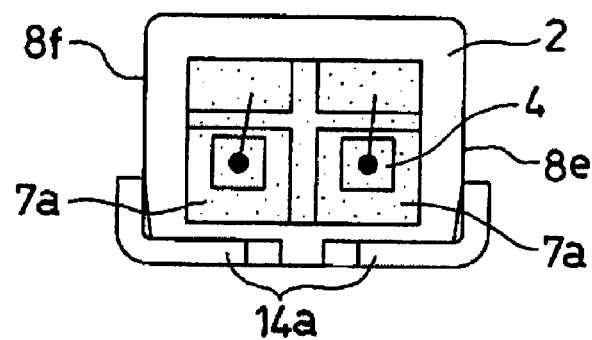
Figure 3B:
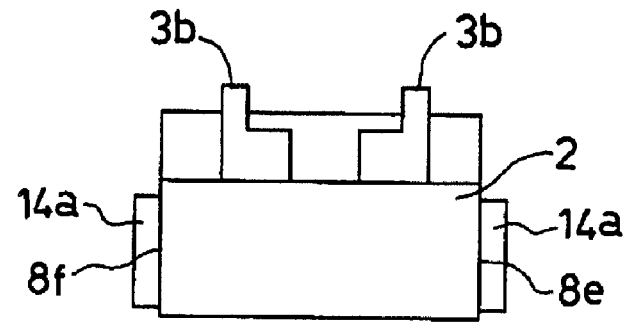
Figure 3C:
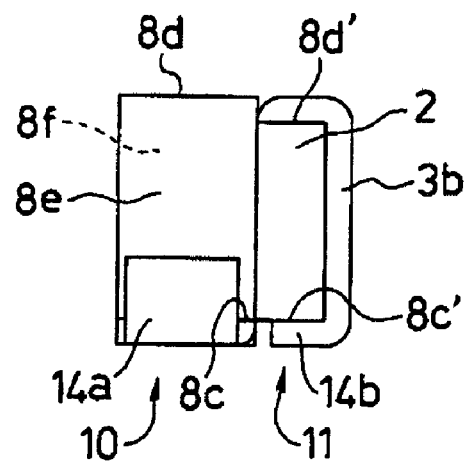
Figure 3D:
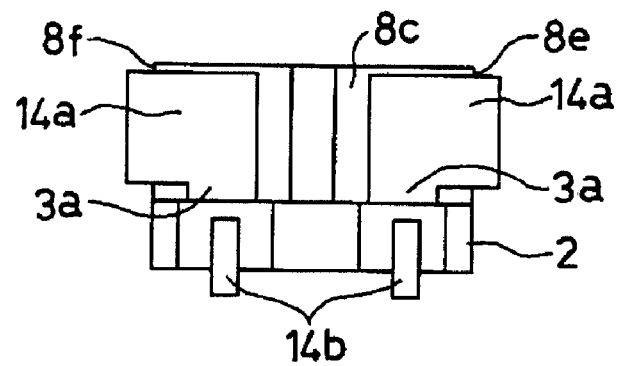
Figure 4A:
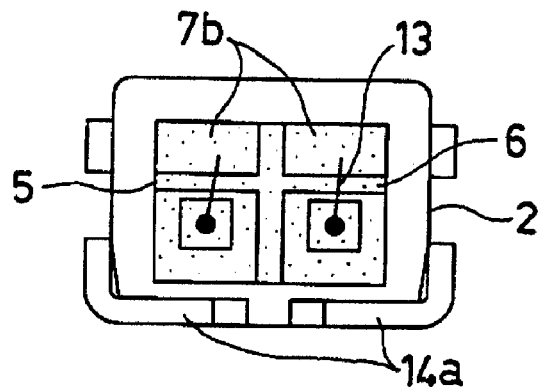
FIGS. 4(a)-(d) are a front view, a top view, a side view and a bottom view for a third exemplary embodiment of a semiconductor optical device made in accordance with principles of the disclosed subject matter.
Figure 4B:
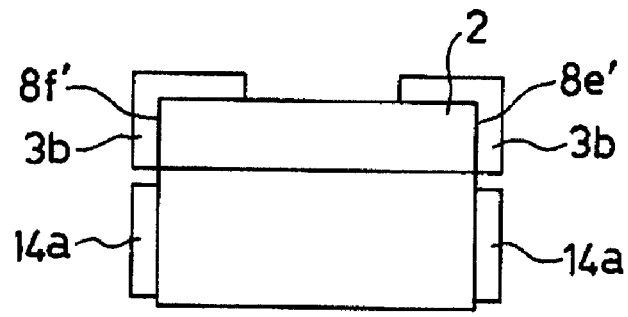
Figure 4C:
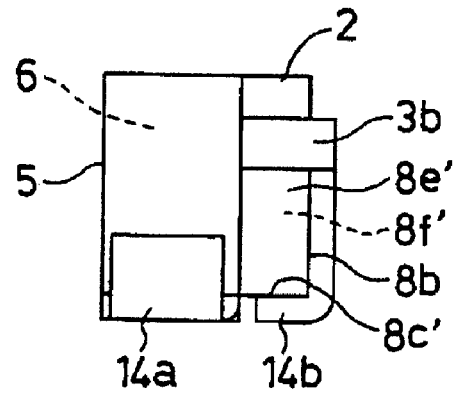
Figure 4D:
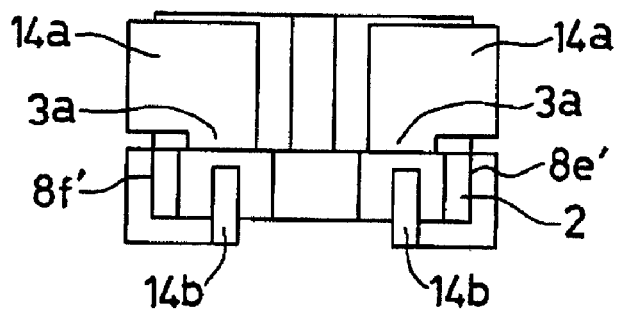

A first exemplary embodiment of the disclosed subject matter will now be described in detail with reference to FIGS. 1(a)-(d) and FIG. 2. FIGS. 1(a)-(d) show a front view, a top view, a side view, and a bottom view in turn for a semiconductor optical device in accordance with the first exemplary embodiment, and FIG. 2 shows the perspective view of the above device shown by FIGS. 1(a)-(d).

The semiconductor optical device 1 in accordance with the first exemplary embodiment can include: a casing 2 made from a resin; two pairs of lead frame electrodes 3a, 3b insert-formed in the resin casing; and semiconductor optical chips 4 having at least one of a light emitting/detecting function.

Actually, the casing 2 can consist of a resin formation, and at least one pair of lead frame electrodes 3a, 3b can be situated in or on the casing 2. The casing 2 defines the resin formation not including the pairs of lead frame electrodes 3a, 3b in the following described exemplary embodiments.

The casing 2 can be substantially cuboid and can be provided with a concave-shaped cavity 6 with an opening 5 and a bottom portion. Each of the one end portions 7a, 7b of the pairs of lead frame electrodes 3a, 3b that is respectively separated from each other and can be exposed on the bottom portion of the concave-shaped cavity 6. In addition, each of the pairs of lead frame electrodes 3a, 3b can extend from respective one end portions 7a, 7b and can protrude or extend from outside surfaces 8c', 8d', etc. of the casing 2 to an outside area.

A surface of the bottom portion of the concave-shaped cavity 6 can be in a position substantially at the same level as the exposed surfaces of each one end portion 7a, 7b of the pair of lead frame electrodes 3a, 3b. The casing 2 can consist of a concave-shaped cavity formation 10 and a lead frame electrode layout portion 11 on either side of the surface of the bottom portion.

Furthermore, an encapsulating resin 12 made of at least one of a transparent resin and a mixture resin which includes a resin mixed with at least one of a diffuser, a phosphor, and a pigment for selectively absorbing light having a predetermined wavelength can be disposed in the concave-shaped cavity 6. The encapsulating resin can encapsulate the semiconductor optical chips 4 and bonding wires 13 described later.

The semiconductor optical chips 4 can be mounted in the concave-shaped cavity 6. The semiconductor optical chips 4 can include the following characteristics individually or in combination: all being composed of at least one semiconductor chip having only a light-emitting function; all being composed of at least one semiconductor chip having only a light-detecting function; and being composed of a mixture of chips that include both the semiconductor optical chips having the light-emitting/detecting functions.

When the semiconductor optical chips are all composed of semiconductor light-emitting chips, the semiconductor optical chips can also include the following characteristics: all being composed of same color light-emitting chips; and being composed of a plurality of different color light-emitting chips.

With respect to the specific semiconductor optical devices, the semiconductor light-emitting chips can be formed as a light emitting diode (LED), a laser diode, etc. and the semiconductor light-detecting chips can be formed as a photodiode, a phototransistor, and the like.

The encapsulating resin 12 can be figured to protect against outside circumstances such as moisture, dust, gas and the like, and to protect the bonding wires 13 from outside forces like vibration, shock, etc. When the semiconductor optical device is composed of at least one semiconductor light-emitting chip, the encapsulating resin 12 can also function to improve a light-producing efficiency of light received from a light-emitting surface of the semiconductor light-emitting chip by forming an interface member between the light-emitting surface of the semiconductor light-emitting chip and the resin 12, and by creating a refractive index that is similar for both the interface member and a semiconductor material of the light-emitting surface of the semiconductor light-emitting chip.

A wavelength conversion material may be mixed in the encapsulating resin 12 when the semiconductor optical device is composed of all semiconductor light-emitting chips. The semiconductor optical device can emit light of various color tone different from the light-emitting color of at least one semiconductor light-emitting chip through action of the wavelength conversion material, by selecting both the light-emitting color and the wavelength conversion material.

More specific description of a case in which a semiconductor optical device is composed of semiconductor light-emitting chips all having the same light-emitting color will now be given. When the above semiconductor light-emitting chip emits blue light (blue LED chip), the semiconductor optical device can emit light of approximately white color tone through use of an encapsulating resin mixed with a wavelength conversion material for converting blue light to a complementary yellow light. A part of the blue light emitted from a blue LED chip excites the wavelength conversion material and converts it to yellow light, which can be mixed with other parts of the blue light emitted from a blue LED chip by means of additive color mixture. Thus, the semiconductor optical device can emit light having an approximately white color tone.

The semiconductor optical device can also emit light of approximately white color tone through an encapsulating resin that is mixed with two wavelength conversion materials for converting blue light to green light and/or red light. A part of the blue light emitted from a blue LED chip excites the two wavelength conversion materials and converts the light to green light and/or red light, which can be added to or mixed with other parts of the blue light emitted from the blue LED chip to generate an approximately white light by means of additive color mixture.

When the above semiconductor light-emitting chip emits ultraviolet light (ultraviolet LED chip), the semiconductor optical device can also emit light of approximately white color tone through use of an encapsulating resin that is mixed with three kinds of wavelength conversion materials for converting ultraviolet light to blue light, green light and red light. The ultraviolet light emitted from ultraviolet LED chip excites the three wavelength conversion materials and converts the light to blue light, green light and red light, which can be added to generate approximately white light by means of additive color mixture.

Furthermore, when the wavelength of light emitted from an LED chip and the type of wavelength conversion material are appropriately selected and combined, light of various color tone other than white light can be generated.

When the semiconductor light-emitting chips are composed of a plurality of light-emitting chips of different light-emitting colors, light of various color tone other than the light-emitting color of the light-emitting chips can be generated through an encapsulating resin that is mixed with a wavelength conversion material.

The light diffuser can provide the following characteristics: uniformity of luminance distribution emitted from a semiconductor light-emitting chip; a light mixture characteristic emitted from the semiconductor light-emitting chips when the semiconductor light-emitting chips are composed of a plurality of light-emitting chips of different light-emitting colors.

The above-described structures can be common in the exemplary embodiments of the disclosed subject matter. Each of the exemplary embodiments will now be described in detail.

FIGS. 1(a)-(d) show a front view, a top view, a side view and a bottom view for the semiconductor optical device in accordance with the first exemplary embodiment. FIG. 2 shows a perspective view for the semiconductor optical device in accordance with FIGS. 1(a)-(d).

The semiconductor optical device can include two pairs of lead frame electrodes $3a$, $3b$, each having end portions $7a$, $7b$, thereof being exposed on the bottom portion of the concave-shaped cavity 6 and being disposed four corners of the bottom portion that is substantially rectangular.

Each adjacent one end portion $7a$ of the two lead frame electrodes $3a$ can include a semiconductor optical chip 4 mounted thereon and can be electrically connected to a bottom of the electrodes of the semiconductor optical chips 4.

Each adjacent one end portion $7b$ of the other two lead frame electrodes $3b$ can be disposed at opposite sides of each adjacent one end portion $7a$ and can be electrically connected through bonding wires 13 to upper electrodes of the semiconductor optical chips 4.

The two lead frame electrodes $3a$ can be: led from each of the end portions $7a$ thereof on which the semiconductor optical chips 4 are mounted and extend into the casing 2; led from the outside surface $8c'$ of the lead frame electrode layout portion 11 of the casing 2 to the outside; and bent substantially perpendicular in the direction of the opening 5 from exits on the outside surface $8c'$ along the outside surface $8c$ of the concave-shaped cavity formation 10.

Each of the tip portions that are bent from the exits include the other end portions $14a$ of the lead frame electrodes $3a$. When the semiconductor optical device 1 is mounted on a circuit board, each of other end portions $14a$ can include the following functions: fixing the semiconductor optical device 1 to a circuit board by connecting to conductor patterns of a circuit board; electrically connecting the semiconductor optical device 1 to a circuit board; and conducting the self-fever (e.g., internal heat build-up) of semiconductor light-emitting chips that are mounted in the semiconductor optical device to conductor patterns of the circuit board through the lead frame electrodes $3a$ that are formed of material that is a good conductor of temperature.

The two lead frame electrodes $3b$ can each have one end portion $7b$ thereof that is electrically connected to an electrode of the semiconductor optical chip 4 through bonding wire 13, the end portion $7b$ extending into the casing 2. The lead frame electrodes $3b$ can each extend from an outside surface $8d'$ opposite to the outside surface $8c'$ to an area outside the casing 2. The electrodes $3b$ can then be bent substantially perpendicular and in a direction extending away from the opposite side of the opening 5 and along the outside surface $8d'$. The electrodes $3b$ can then be bent substantially perpendicular with respect to the outside surface $8d'$ and extend along an outside surface $8b$. Finally, the lead frame electrodes can be bent substantially perpendicular to the outside surface $8b$ and in a direction towards the opening 5 while extending along the outside surface $8c'$.

Each of the tip portions of the electrodes $3b$ that are finally bent in the direction of the opening 5 can terminate in other end portions $14b$ of the lead frame electrodes $3b$. When the semiconductor optical device 1 is mounted on a circuit board, each of the other end portions $14b$ can be configured to fix the semiconductor optical device 1 to a circuit board by connecting to conductor patterns of a circuit board, and can provide an appropriate structure for electrically connecting the semiconductor optical device 1 to a circuit board.

Outside surfaces of each of the other end portions $14a$ of the lead frame electrodes $3a$ and each of the other end portions $14b$ of the lead frame electrodes $3b$ can contact conductor patterns of a circuit board to mount the semiconductor optical device 1 thereon. Thus, outside surfaces of each of the above end portions $14a$, $14b$ can be disposed on substantially the same level (e.g., co-planar) in order to provide a stable surface and provide sufficient mounting strength for the semiconductor optical device 1. In addition, the above-described disposition of the end portion $14a$, $14b$ can increase a parallel precision between the semiconductor optical device and a circuit board to facilitate mounting of the semiconductor optical device 1 on a circuit board.

The encapsulating resin 12 can be disposed in the concave-shaped cavity portion 6 of the casing 2 as described above and can encapsulate semiconductor optical chips 4 and bonding wire 13 therein.

A second exemplary embodiment of the disclosed subject matter will now be described in detail with reference to FIGS. 3(a)-(d). FIGS. 3(a)-(d) show a front view, a top view, a side view and a bottom view of a semiconductor optical device made in accordance with a second exemplary embodiment.

Differences between the second exemplary embodiment and the first exemplary embodiment can include: each of other end portions 14a that are bent along the outside surface 8c in the first exemplary embodiment; and -+each of the tip parts of the other end portions 14a being again bent substantially perpendicular to the outside surface 8c in a direction towards outside surface 8d and extending along outside surfaces 8e, 8f of the concaved-shaped cavity formation 10.

When the semiconductor optical device 1 in the second exemplary embodiment is mounted on a circuit board, each of other end portions 14a that include each of the above-described tip parts that are bent along the outside surfaces 8e, 8f can include be configured to exhibit the following functions: fixing the semiconductor optical device 1 to a circuit board by connecting to conductor patterns of a circuit board; electrically connecting the semiconductor optical device 1 to a circuit board; and conducting the self-fever of the semiconductor light-emitting chips 4 mounted in the semiconductor optical device 1 to the conductor patterns of a circuit board through the lead frame electrodes 3a.

In the above-described second exemplary embodiment, structures other those described immediately above can be the same as in the first exemplary embodiment of FIGS. 1(a)-(d).

A third exemplary embodiment of the disclosed subject matter will now be described with reference to FIGS. 4(a)-(d). FIGS. 4(a)-(d) show a front view, a top view, a side view and a bottom view of a semiconductor optical device made in accordance with a third exemplary embodiment.

Differences between the third exemplary embodiment and the second exemplary embodiment can include; a different directional configuration within the casing 2 for the two lead frame electrodes 3b which each include an end portion 7b connected via bonding wires 13 to the semiconductor chip 4; and a different directional configuration outside of the casing 2 for the two lead frame electrodes 3b.

Specifically, the two lead frame electrodes 3b can be configured as follows: each of the one end portions 7b can be exposed in the cavity of the casing 2 in a same manner as shown in the second exemplary embodiment; the electrodes 3b can be configured to extend from outside surfaces 8e', 8f' which are perpendicular to the outside surface 8c' on which the two lead frame electrodes 3a extend; the electrodes 3b can be bent substantially perpendicular and in a direction extending opposite from the side with the opening 5 from exits on the outside surfaces 8e', 8f' and along the outside surfaces 8e', 8f'; the electrodes 3b can then be bent substantially perpendicular to the outside surface 8e', 8f' in the direction of and along the outside surface 8b; the electrodes 3b can then be bent substantially perpendicular with respect to the outside surface 8b and in a direction of the outside surface 8c' substantially perpendicular to the outside surface 8b such that the electrodes 3b extend in the direction of the opening 5 and along the outside surface 8c'. The two lead frame electrodes 3b in the above third exemplary embodiment can extend through the outside surface 8b. However, it is possible that the two lead frame electrodes 3b extend from the outside surfaces 8e', 8f' to the outside surface 8c' along the outside surfaces 8e', 8f' while not extending through the outside surface 8b.

In the above-described third exemplary embodiment, structures other than those described immediately above can be the same as those in the second exemplary embodiment of FIGS. 3(a)-(d).

A fourth exemplary embodiment of the disclosed subject matter will now be described with reference to FIGS. 5(a)-(d). FIGS. 5(a)-(d) show a front view, a top view, a side view and a bottom view of a semiconductor optical device in accordance with the fourth exemplary embodiment.

Differences between the fourth exemplary embodiment and the second exemplary embodiment can include the two lead frame electrodes 3b being cut prior to extending along the outside surface 8c' (without including a bend that is substantially perpendicular to the outside surface 8b and in the direction of the opening 5 along the outside surface 8c').

Specifically, the two lead frame electrodes 3b can be configured to: extend from the outside surface 8d' opposite to the outside surface 8c' to a location exterior of the casing 2 and then extend along the outside surface 8b, similar to the second exemplary embodiment; each edge 15 of the other end portions 14b of the electrodes 3b can extend and terminate at a substantially same level as (e.g. co-planar with) the outside surfaces of the other end portions 14a of the two lead frame electrodes 3a.

Figure 5A:
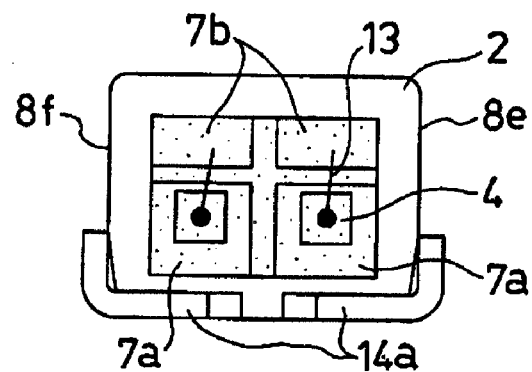
FIGS. 5(a)-(d) are a front view, a top view, a side view and a bottom view for a fourth exemplary embodiment of a semiconductor optical device made in accordance with principles of the disclosed subject matter.
Figure 5B:
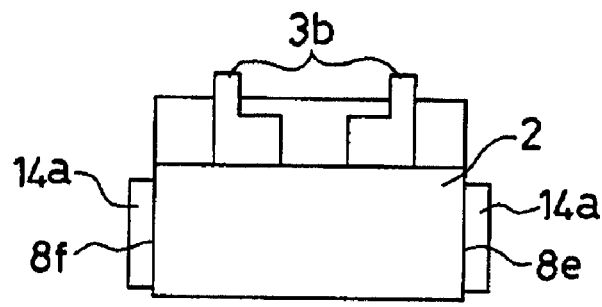
Figure 5C:
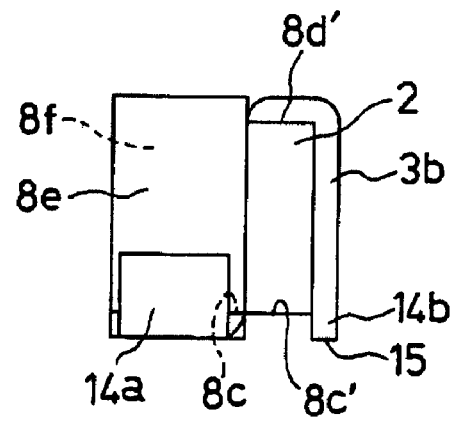
Figure 5D:
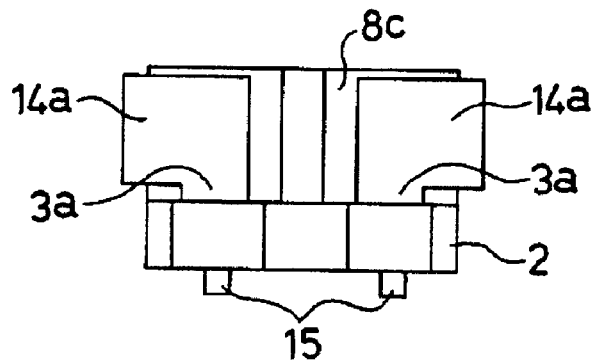
Figure 6A:
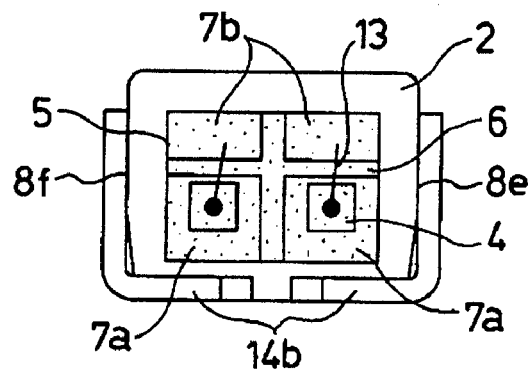
FIGS. 6(a)-(d) are a front view, a top view, a side view and a bottom view for a fifth exemplary embodiment of a semiconductor optical device made in accordance with principles of the disclosed subject matter.
Figure 6B:
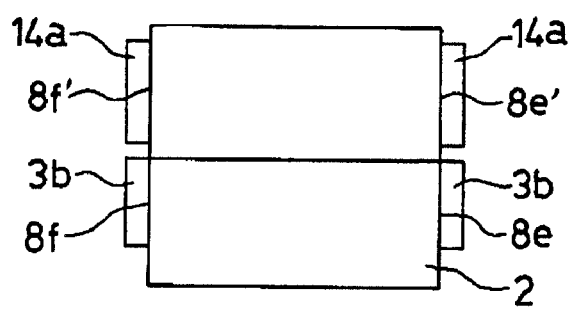
Figure 6C:
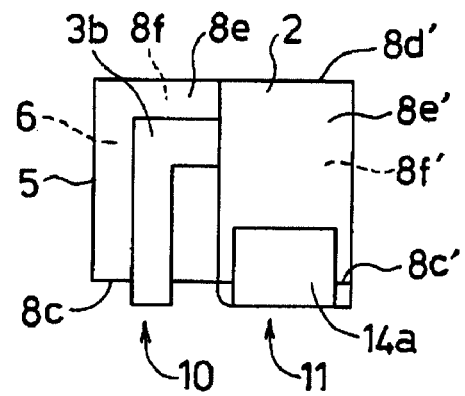
Figure 6D:
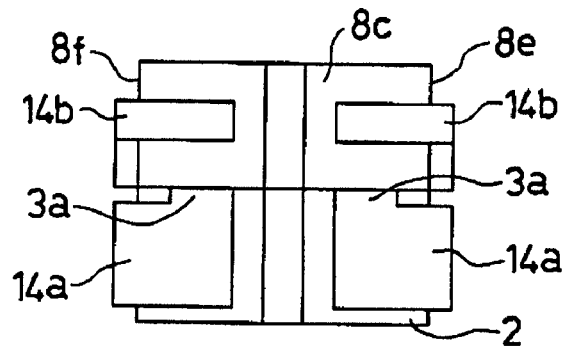
Figure 7A:
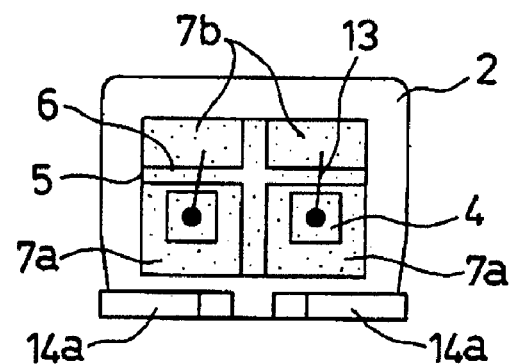
FIGS. 7(a)-(d) are a front view, a top view, a side view and a bottom view for a sixth exemplary embodiment of a semiconductor optical device made in accordance with principles of the disclosed subject matter.
Figure 7B:
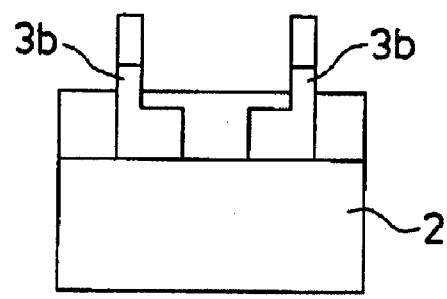
Figure 7C:
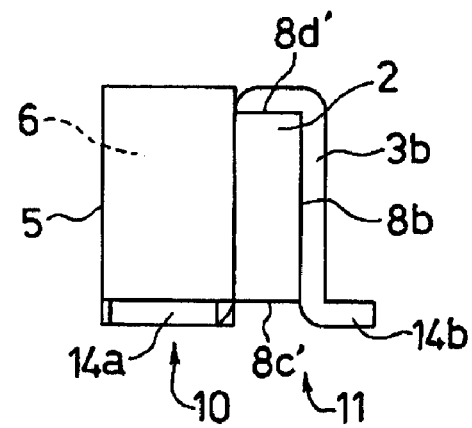
Figure 7D:
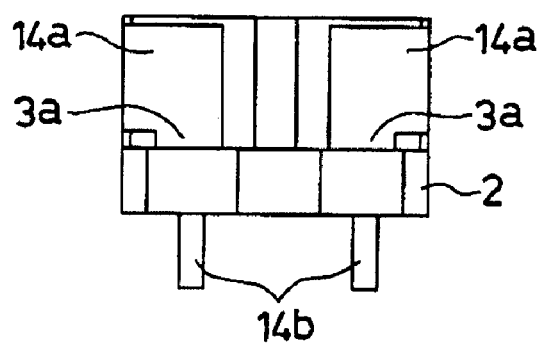
Figure 8A:
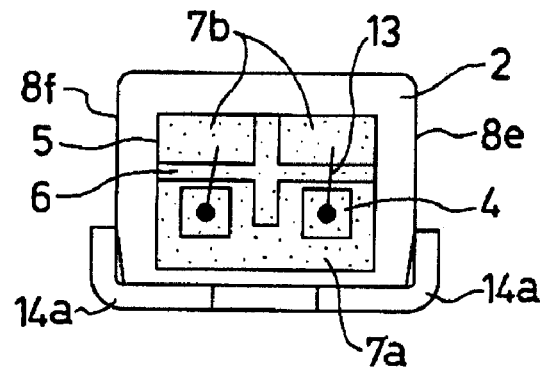
FIGS. 8(a)-(d) are a front view, a top view, a side view and a bottom view for a seventh exemplary embodiment of a semiconductor optical device made in accordance with principles of the disclosed subject matter.
Figure 8B:
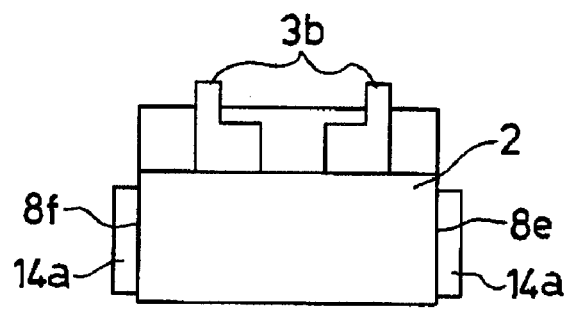
Figure 8C:
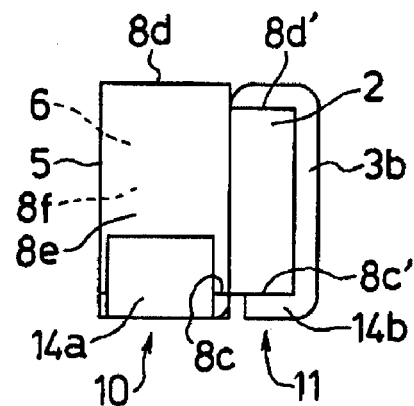
Figure 8D:
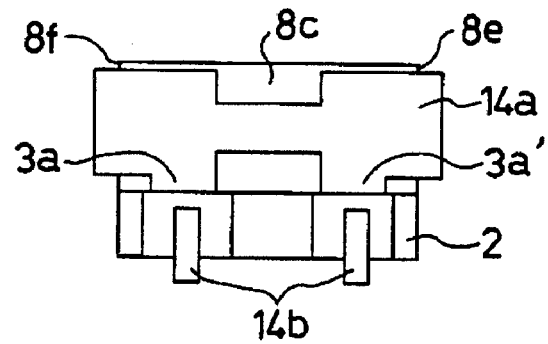
Figure 9A:
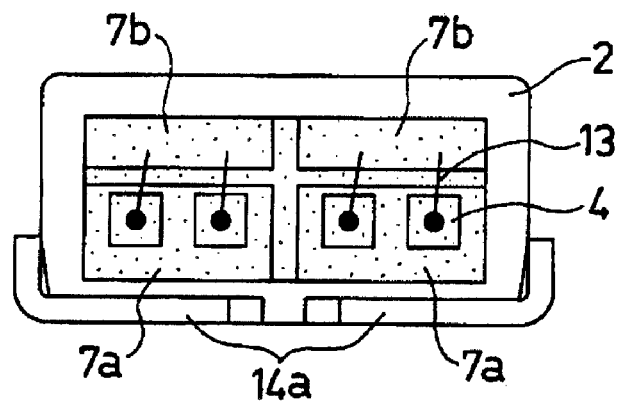
FIGS. 9(a)-(d) are a front view, a top view, a side view and a bottom view for an eighth exemplary embodiment of a semiconductor optical device made in accordance with principles of the disclosed subject matter.
Figure 9B:
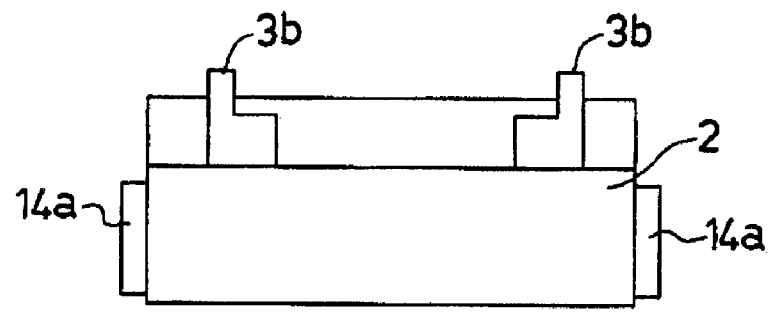
Figure 9C:
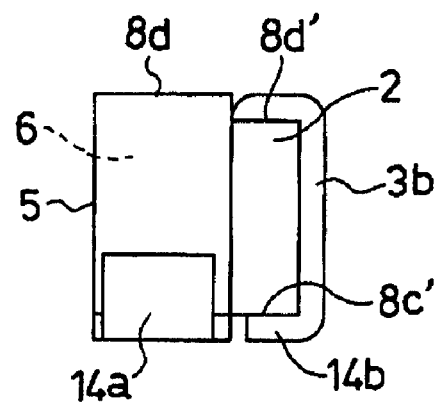
Figure 9D:
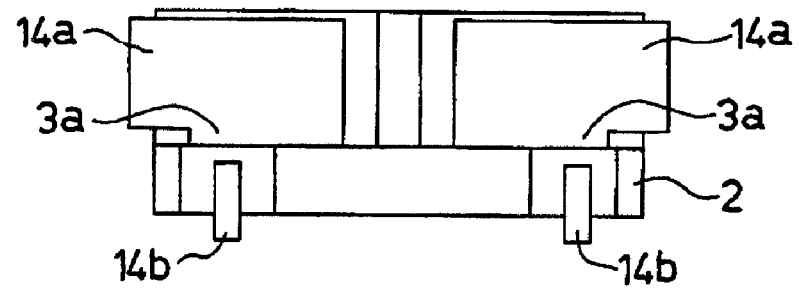

Thus, when the semiconductor optical device 1 in the fourth exemplary embodiment is mounted on a circuit board, each of other end portions 14b that include edge 15 can include the following functions: fixing the semiconductor optical device 1 to a circuit board by connecting to conductor patterns of a circuit board; and electrically connecting the semiconductor optical device 1 to a circuit board. In the fourth exemplary embodiment, each edge 15 of the other end portions 14b of the two lead frame electrodes 3b can be disposed on a level that is substantially co-planar with the outside surfaces of the other end portions 14a of the two lead frame electrodes 3a as shown in FIG. 5(c). However, the two lead frame electrodes 3b can also further extend so as to allow at least one edge 15 thereof to be insertable into a circuit board. The above structure enables the semiconductor optical device 1 to ensure positioning with respect to the circuit board.

In the above-described fourth exemplary embodiment, structures other than those described immediately above description can be the same or similar to those described with respect to the second exemplary embodiment.

A fifth exemplary embodiment of the disclosed subject matter will now be described with reference to FIGS. 6(a)-(d). FIGS. 6(a)-(d) show a front view, a top view, a side view and a bottom view for the semiconductor optical device in accordance with the fifth exemplary embodiment.

In the fifth exemplary embodiment, the two lead frame electrodes 3a can be configured to have the following characteristics: include end portions 7a that have a semiconductor optical chip 4 mounted thereon and which then extend into the casing 2; the electrodes 3a extend from the outside surface 8c' of the lead frame electrode layout portion 11 of the casing 2 to an area outside the casing 2; the electrodes then being bent substantially perpendicular in a direction extending away from or opposite the opening 5 and then extending along the outside surface 8c'; and each tip part of the other end portions 14a being bent substantially perpendicular to the outside surface 8c' in a direction towards the outside surface 8d' of the casing 2 so as to extend along the outside surfaces 8e', 8f', respectively, of the lead frame electrode layout portion 11.

When the semiconductor optical device 1 is mounted on a circuit board, each of other end portions 14a can provide the following functional characteristics: fixing the semiconductor optical device 1 to a circuit board by connecting to conductor patterns of a circuit board; electrically connecting the semiconductor optical device 1 to a circuit board; and conducting the self-fever of semiconductor light-emitting chips mounted in the semiconductor optical device to the conductor patterns of a circuit board through the lead frame electrodes 3a that are formed a good conductor of temperature.

The two lead frame electrodes 3b can be configured to have the following characteristics: the lead frame electrodes 3b can include one end portions 7b thereof that are electrically connected to semiconductor optical chips 4 through bonding wires 13 and which extend into the casing 2; the electrodes 3b are bent substantially perpendicular to extend in the direction towards the opening 5 and along the outside surface 8e, 8f of the concave-shaped cavity formation 10; then bent substantially perpendicular to extend in the direction towards the outside surface 8c and along the outside surfaces 8e, 8f; and are then bent substantially perpendicular to the outside surface 8e, 8f to extend in the direction towards a respective opposite side of the outside surfaces 8f, 8e and along the outside surface 8c.

When the semiconductor optical device 1 in the fifth exemplary embodiment is mounted on a circuit board, each of other end portions 14b which include tip parts that are finally bent and extend along the outside surface 8c can provide the following functional characteristics: fixing the semiconductor optical device 1 to a circuit board by connecting to conductor patterns of a circuit board; and electrically connecting the semiconductor optical device 1 to a circuit board.

Particularly, each outside surface of both the other end portions 14a of the two lead frame electrodes 3a and the other end portions 14b of the two lead frame electrodes 3b can face conductor patterns of a circuit board. When the semiconductor optical device 1 is mounted on a circuit board, each of the outside surfaces of the electrodes 3a and 3b (e.g., outside bottom most surfaces of other end portions 14a, 14a, 14b, 14b) can be disposed on a substantially same level (e.g., substantially co-planar) in order to maintain a mounting strength for the semiconductor optical device 1 and to increase parallel precision of the semiconductor optical device 1 against a circuit board.

The two lead frame electrodes 3b may include end portions 7b thereof that are electrically connected to the semiconductor optical chips 4 via bonding wires 13. The electrodes 3b then extend into the casing 2, and to the outside surface 8e' and 8f', respectively, and then towards the outside surface 8c upon which they are bent and extend onto at their other end portions 14b. The lead frame electrodes 3a extend onto outside surface 8c' at their other end portions 14a to provide, in conjunction with the end portions 14b, a surface mount platform for the lead frame portion 11.

A sixth exemplary embodiment of the disclosed subject matter will now be described with reference to FIGS. 7(a)-(d). FIGS. 7(a)-(d) show a front view, a top view, a side view and a bottom view of a semiconductor optical device made in accordance with the 6th exemplary embodiment.

Differences between the sixth exemplary embodiment and the first exemplary embodiment can include differences between respective structures that comprise the two lead frame electrodes 3b. For example, each of other end portions 14b of the sixth exemplary embodiment are bent in an opposite direction and away from the outside surface 8b as compared to the end portion 14b in the first exemplary embodiment which is bent towards and extends along the outside surface 8c'.

Specifically, the two lead frame electrodes 3b can: extend from each of the one end portions 7b thereof that have the semiconductor optical chips 4 connected thereto via bonding wires 13 and which then extend into the casing 2; extend from the outside surface 8d' to the outside of the casing 2 and extend along surface 8d' towards surface 8b; then be bent substantially perpendicular to the surface 8d' and in a direction towards the outside surface 8c' while extending along the outside surface 8b; and finally being bent substantially perpendicular in the direction opposite to the side of the opening 5 and away from the outside surface 8b to terminate at its other end portions 14b.

When the semiconductor optical device 1 in the sixth exemplary embodiment is mounted on a circuit board, each of other end portions 14b include tip parts that are finally bent in the direction opposite to the side of the opening 5 and can be configured to provide the following functions and characteristics: fixing the semiconductor optical device 1 to a circuit board by connecting to conductor patterns of a circuit board; and electrically connecting the semiconductor optical device 1 to a circuit board.

Particularly, each outside surface of both the other end portions 14a of the two lead frame electrodes 3a and the other end portions 14b of the two lead frame electrodes 3b can face conductor patterns of a circuit board. When the semiconductor optical device 1 is mounted on the circuit board via the electrodes 3a and 3b, each of the above-described outside surfaces can be disposed on a substantially same level (e.g. can be co-planar at their bottom most surface) in order to maintain a mounting strength of the semiconductor optical device 1 and to increase a parallel precision of the semiconductor optical device 1 against the circuit board.

In the above-described sixth exemplary embodiment, structures other than those that are described above can be the same or similar to those disclosed with respect to the second exemplary embodiment.

A seventh exemplary embodiment of the disclosed subject matter will now be described with reference to FIGS. 8(a)-(d). FIGS. 8(a)-(d) show a front view, a top view, a side view and a bottom view for a semiconductor optical device made in accordance with the seventh exemplary embodiment.

Differences between the seventh exemplary embodiment and the second exemplary embodiment can include difference with respect to the lead frame electrodes 3a. Specifically, in the seventh exemplary embodiment, the electrodes 3a can be configured as a single integral electrode 3a in which one end portion 7a can be configured for mounting both of the semiconductor optical chips 4 thereon, and the two other end portions 14a can be configured to be a single integral end portion 14a formed as one body.

Thus, the semiconductor optical device can include: one lead frame electrode 3a, one end portion 7a thereof exposed at the bottom portion of the concave-shaped cavity 6 in the casing 2; and two lead frame electrodes 3b, each having one end portions 7b that are separated on the opposite side of the one end portion 7a and being exposed on the bottom portion of the concave-shaped cavity 6. Two semiconductor optical chips can be mounted on the one end portion 7a and can have one electrode thereof electrically connected to the one end portion 7a, and the other electrode thereof being electrically connected to each of the one end portions 7b through bonding wires 13.

The lead frame electrode 3a can be configured as follows: the one end portion 7a on which the two semiconductor optical chips 4 are mounted can extend into the casing 2; the electrode 3a can then extend from the outside surface 8c' of the lead frame electrode layout portion 11 of the casing 2 to an area outside of the casing 2; the electrode 3a can then be bent substantially perpendicular from two exits on the outside surface 8c' and in the direction towards the opening 5 but along the outside surface 8c of the concave-shaped cavity formation 10, at some point the two portions of the electrode 3a that extend at separate locations from the casing 2 are coupled as they extend along the outside surface 8c and reform as one body; and both side tip parts of the other end portion 14a are bent substantially perpendicular in a direction towards the outside surface 8d of the casing 2 and extend along the outside surfaces 8e, 8f of the concave-shaped cavity formation 10.

When the semiconductor optical device 1 of the seventh exemplary embodiment is mounted on a circuit board, the other end portion 14a that includes both side tip parts that are coupled as a single body on the outside surface 8c and which are then finally bent at separate locations along the outside surfaces 8e, 8f, can include the following functional characteristics: fixing the semiconductor optical device 1 to a circuit board by connecting to conductor patterns of a circuit board; electrically connecting the semiconductor optical device 1 to a circuit board; and conducting the self-fever of the semiconductor light-emitting chips 4 to the conductor patterns of the circuit board through the lead frame electrode 3a.

In the above-described seventh exemplary embodiment, structures other than those described immediately above can be the same or similar to those described with respect to the second exemplary embodiment.

An eighth exemplary embodiment of the disclosed subject matter will now be described with reference to FIGS. 9(a)-(d). FIGS. 9(a)-(d) show a front view, a top view, a side view and a bottom view for a semiconductor optical device made in accordance with the eighth exemplary embodiment.

Differences between the eighth exemplary embodiment and the second exemplary embodiment can include the provision of two semiconductor optical chips in the eighth exemplary embodiment that are on the pair of lead frame electrode 3a, 3b. Each of the one end portions 7a of the lead frame electrodes 3a can be exposed on the bottom surface of the concave-shaped cavity portion 6, and can include two semiconductor optical chips 4 mounted thereon via connection to an electrode of each of the semiconductor optical chips 4. Each of the one end portions 7b of the lead frame electrodes 3b can be exposed on the bottom surface, and can be separated from and opposed to each one end portion 7a, and can be electrically connected to the other electrode of the semiconductor optical chips 4.

In the above-described eighth exemplary embodiment, structures other than those described immediately above can be the same as those of the second exemplary embodiment.

A ninth exemplary embodiment of the disclosed subject matter will now be described in detail with reference to FIGS. 10(a)-(d). FIGS. 10(a)-(d) show a front view, a top view, a side view and a bottom view for a semiconductor optical device made in accordance with the ninth exemplary embodiment.

Figure 10A:
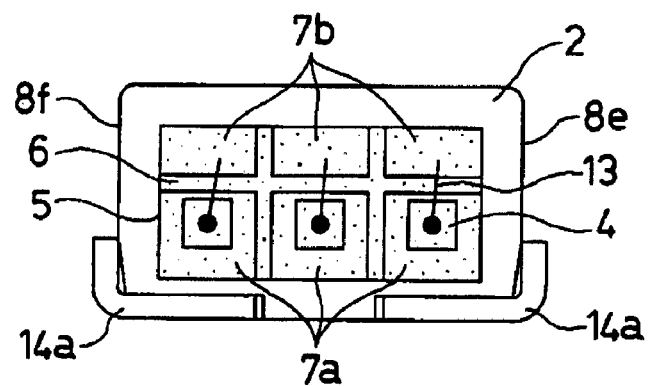
FIGS. 10(a)-(d) are a front view, a top view, a side view and a bottom view for a ninth exemplary embodiment of a semiconductor optical device made in accordance with principles of the disclosed subject matter.
Figure 10B:
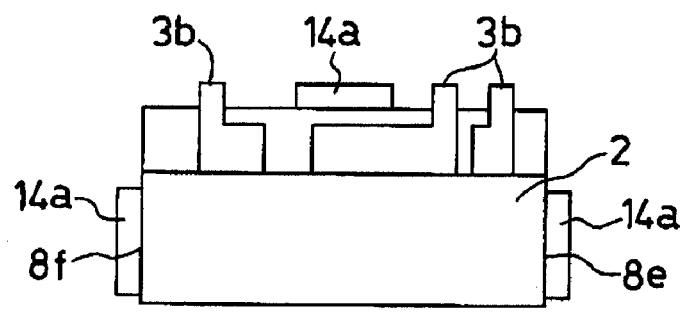
Figure 10C:
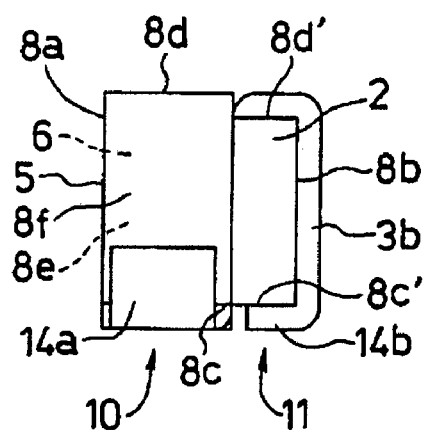
Figure 10D:
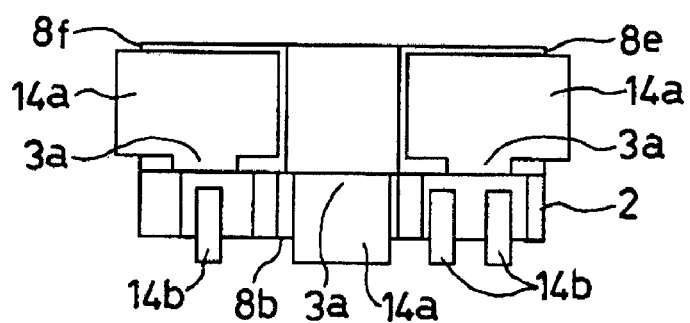
Figure 11A:
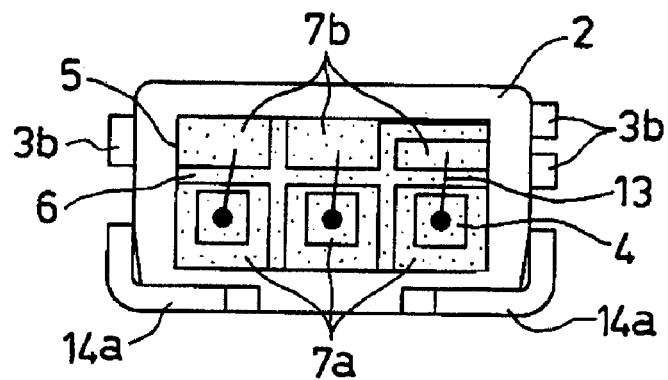
FIGS. 11(a)-(d) are a front view, a top view, a side view and a bottom view for a tenth exemplary embodiment of a semiconductor optical device made in accordance with principles of the disclosed subject matter.
Figure 11B:
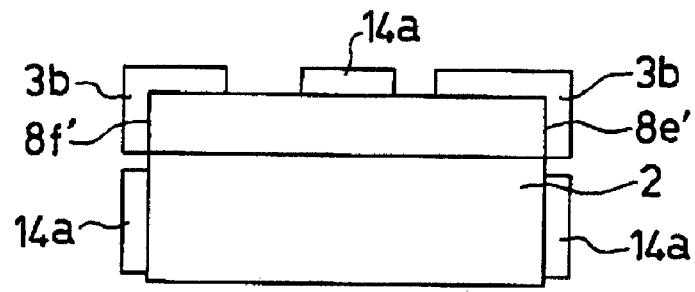
Figure 11C:
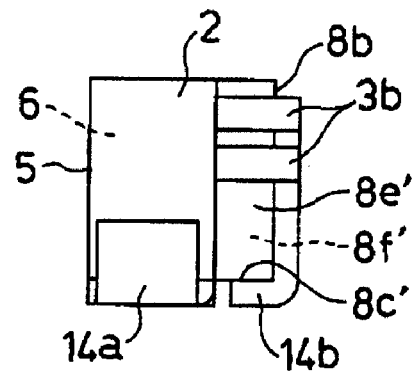
Figure 11D:
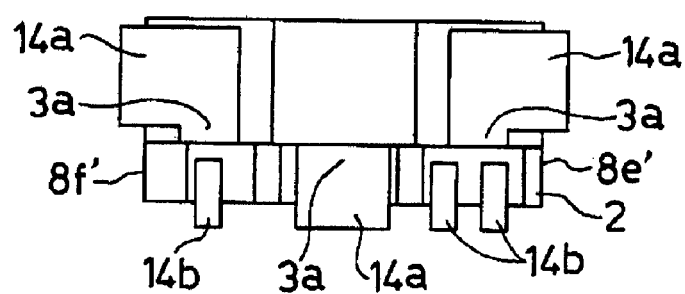
Figure 12A:
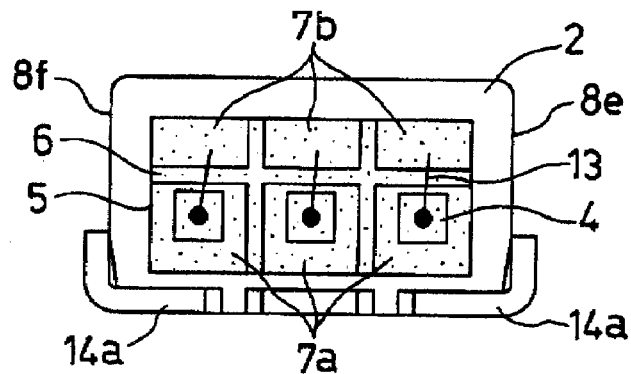
FIGS. 12(a)-(d) are a front view, a top view, a side view and a bottom view for an eleventh exemplary embodiment of a semiconductor optical device made in accordance with principles of the disclosed subject matter.
Figure 12B:
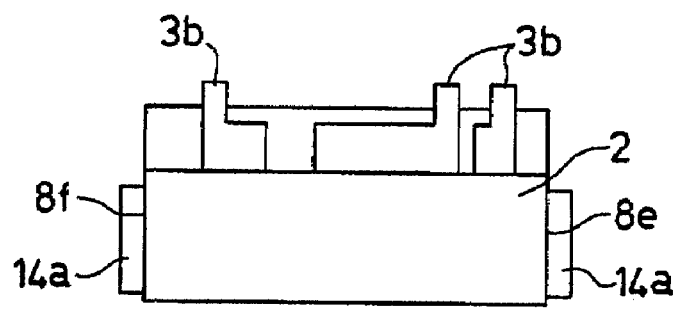
Figure 12C:
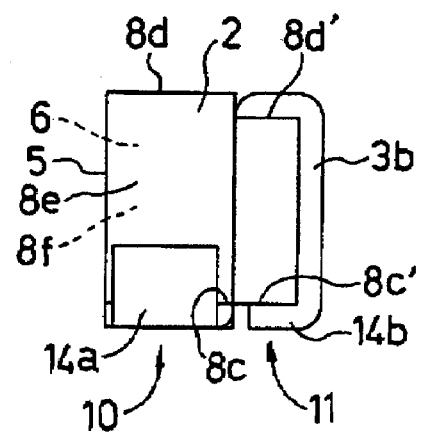
Figure 12D:
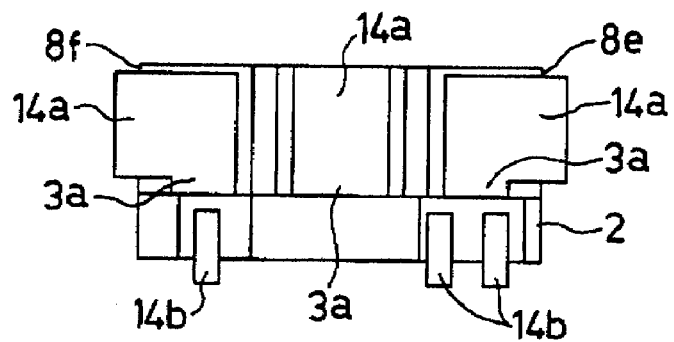
Figure 13A:
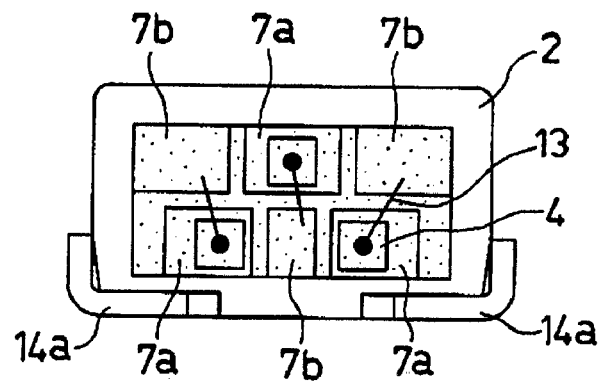
FIGS. 13(a)-(d) are a front view, a top view, a side view and a bottom view for a twelfth exemplary embodiment of a semiconductor optical device made in accordance with principles of the disclosed subject matter.
Figure 13B:
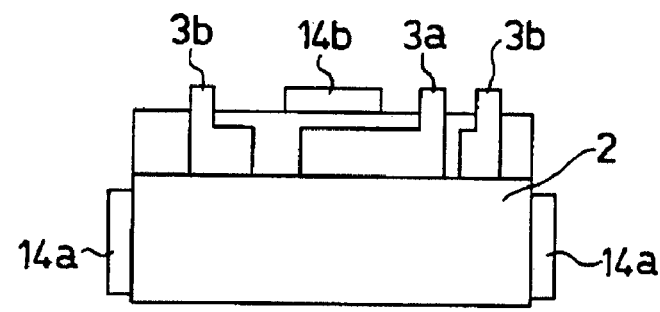
Figure 13C:
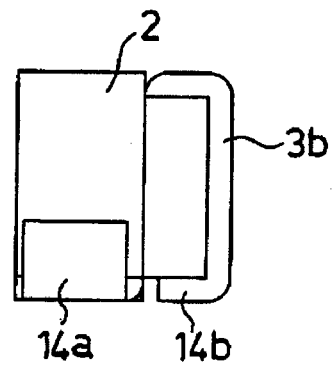
Figure 13D:
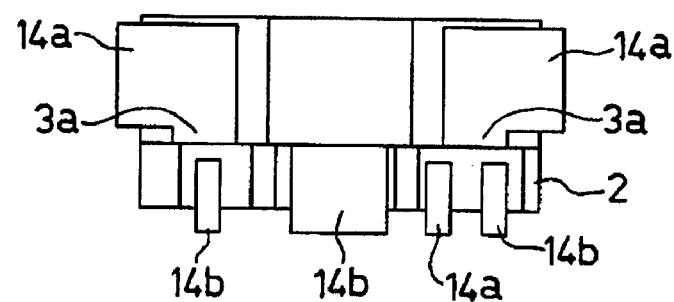
Figure 14A:
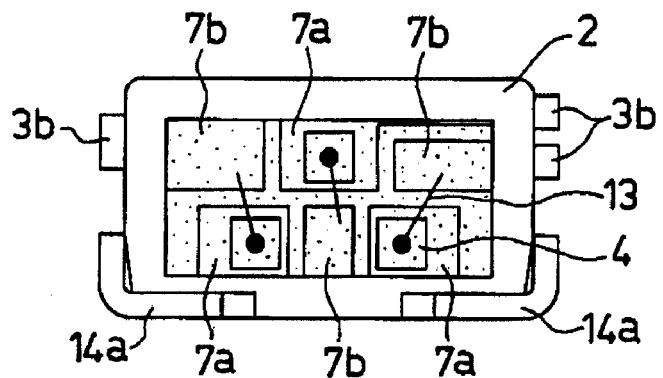
FIGS. 14(a)-(d) are a front view, a top view, a side view and a bottom view for a thirteenth exemplary embodiment of a semiconductor optical device made in accordance with 1 principles of the disclosed subject matter.
Figure 14B:
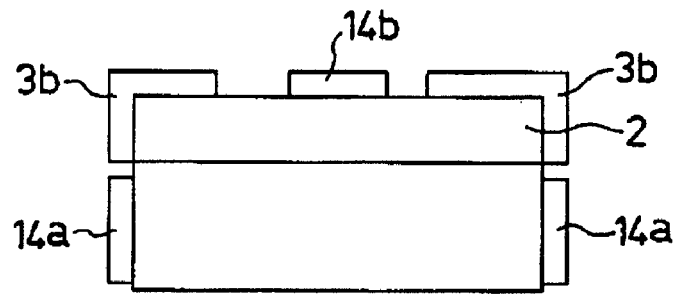
Figure 14C:
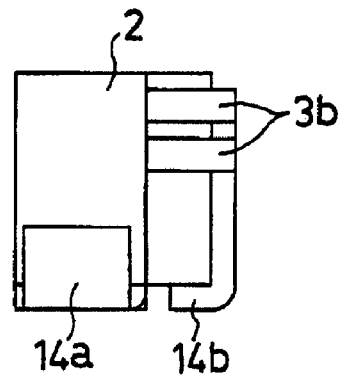
Figure 14D:
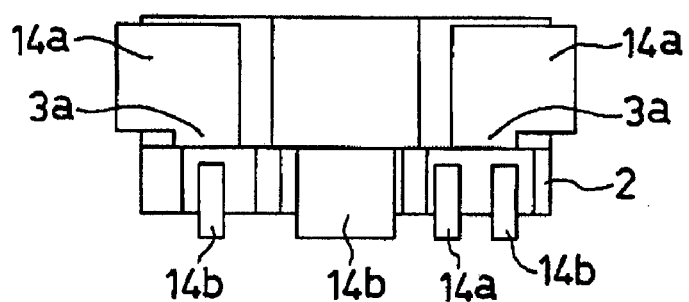

A semiconductor optical device in accordance with the ninth exemplary embodiment can include three pairs of lead frame electrode 3a, 3b. Each of the one end portions 7a, 7b of the electrodes 3a, 3b can be disposed on respective opposite sides with respect to each other and can be composed of three adjacent portions as shown in FIG. 10(a).

Each of the three adjacent one end portions 7a can include a semiconductor optical chip 4 mounted thereon with electrical connection to one electrode of the semiconductor optical chip 4. Each of the three adjacent one end portions 7b can be separately disposed on the respective opposite sides of the three adjacent one end portions 7a, and can be electrically connected with the other electrode of the semiconductor optical chip 4 via bonding wires 13.

The three adjacent lead frame electrode 3a can be configured as follows: each of the one end portions 7a can extend into the casing 2; the lead frames 3a can all then extend from the outside bottom surface 8c' of the lead frame electrode layout portion 11 of the casing 2 and to an area outside of the casing 2. The outermost pair of the three adjacent lead frame electrodes 3a can then be bent substantially perpendicular from exits on the outside surface 8c' and in a direction towards the opening 5 (in an optical axis direction) and along the outside surface 8c of the concave-shaped cavity formation 10, and can include side tip parts of the other end portions 14a that are again bent substantially perpendicular to the surface 8c and in a direction towards the outside surface 8d of the casing 2 while extending along the outside surfaces 8e, 8f of the concave-shaped cavity formation 10.

A middle lead frame electrode 3a (located between the outermost pair of lead frame electrodes 3a describe above) can extend from an exit on the outside surface 8c' and then be bent substantially perpendicular in a direction away from the side that include the opening 5 while also extending along the outside surface 8c'. A tip part of the other end portion 14a of this middle lead frame electrode 3a is then bent substantially perpendicular in a direction towards the outside surface 8d' of the casing 2 while extending along the outside surface 8b of the lead frame electrode layout portion 11.

When the semiconductor optical device 1 of the ninth exemplary embodiment is mounted on a circuit board, the other end portions 14a including the above-described tip parts that are disposed on the outside surfaces 8c, 8c', 8e, 8f and 8b can include the following functional characteristics: fixing the semiconductor optical device 1 to a circuit board by connecting to conductor patterns of a circuit board; electrically connecting the semiconductor optical device 1 to a circuit board; and conducting the self-fever of the semiconductor light-emitting chips 4 that are mounted in the semiconductor optical device 1 to the conductor patterns of a circuit board through the lead frame electrodes 3a.

Each of the three adjacent lead frame electrodes 3b that include one end portion 7b are electrically connected the other electrodes of the semiconductor optical chips 4 through bonding wires 13 and can be configured as follows: the end portions 7b of the electrodes 3b can extend into the casing 2; the electrodes 3b can then extend from the outside surfaces 8d' to an area outside of the casing 2; the electrodes can then be bent substantially perpendicular at the exit on the outside surface 8d' and in a direction away from the opening 5 and extending along the outside surface 8d'; the electrodes 3b can then all be bent substantially perpendicular with respect to the surface 8d' and extend in a direction towards the outside surface 8c while running along the outside surfaces 8b from the outside surface 8d'; upon arrival at the surface 8c, the electrodes 3b can then be bent substantially perpendicular to the outside surface 8b and in a direction towards the opening 5 so as to extend along the outside surface 8c' from the outside surface 8b.

When the semiconductor optical device 1 in the ninth exemplary embodiment is mounted on a circuit board, each of the other end portions 14b that includes tip parts which terminate at a position along the outside surface 8c' can include the following functional characteristics: fixing the semiconductor optical device 1 to a circuit board by connecting to conductor patterns of a circuit board; and electrically connecting the semiconductor optical device 1 to a circuit board.

Particularly, each outside surface of the other end portions 14a, 14b of the three lead frame electrodes 3a, and three electrodes 3b can face conductor patterns of a circuit board upon which the semiconductor optical device 1 is mounted. When the semiconductor optical device 1 is mounted on a circuit board, each of the above outside surfaces can be disposed on a substantially same level (e.g., can be co-planar) in order to maintain a mounting strength of the semiconductor optical device 1 and to increase a parallel precision of the semiconductor optical device 1 against a circuit board.

A tenth exemplary embodiment of the disclosed subject matter will now be described with reference to FIGS. 11(a)-(d). FIGS. 11(a)-(d) show a front view, a top view, a side view and a bottom view for a semiconductor optical device made in accordance with the tenth exemplary embodiment.

Differences between the tenth exemplary embodiment and the ninth exemplary embodiment can include different directions into/out of the casing 2 by which the three adjacent lead frame electrodes 3b extend. Each of the one end portions 7b is electrically connected to the semiconductor optical chip 4 via a bonding wire 13.

Specifically, the three adjacent lead frame electrodes 3b, each having one end portions 7b, can extend from outside surfaces 8e', 8f' to an area outside the casing 2; the electrodes 3b can then be bent substantially perpendicular with respect to a direction away from the opening 5 from exits on the outside surfaces 8e', 8f' and then extend along the outside surfaces 8e', 8f'; the electrodes 3b can then be bent substantially perpendicular with respect to the outside surface 8e', 8f' and in a direction extending along the outside surface 8b; then the electrodes can be bent substantially perpendicular to and in a direction towards the outside surface 8c' while continuing to extend along the outside surface 8b; after arrival at the surface 8c' the electrodes 3b can be bent substantially perpendicular with respect to the outside surface 8b and in a direction towards the opening 5 while extending along the outside surface 8c'.

In the above-described exemplary embodiment, each of the three adjacent lead frame electrodes 3b with end portions 7b can be divided into one primary lead frame electrode 7b and two secondary lead frame electrodes 7b, each extending from the outside surfaces 8e', 8f' to the area outside the casing 2, and then each being bent along the outside surface 8c' through different paths.

In the above-described tenth exemplary embodiment, structures other than those described immediately above can be the same or similar to those described with respect to the ninth exemplary embodiment.

An eleventh exemplary embodiment of the disclosed subject matter will now be described with reference to FIGS. 12(a)-(d). FIGS. 12(a)-(d) show a front view, a top view, a side view and a bottom view of a semiconductor optical device made in accordance with the eleventh exemplary embodiment.

Differences between the eleventh exemplary embodiment and the ninth exemplary embodiment can include the configuration of the three adjacent lead frame electrodes 3a. For example, in the eleventh embodiment, each of the one end portions 7a thereof that have a semiconductor optical chips 4 mounted thereon are configured to extend into and through the casing 2 to an area outside of the casing from surface 8c' of the lead frame electrode layout portion 11. After the lead frames 3a exit from the surface 8c', they are bent substantially perpendicularly with respect to the front surface of the device and in a direction towards the opening 5 while extending along the outside surface 8c of the concave-shaped cavity portion 10. In the pair of electrodes at the outermost portion of the device, both outside tip parts of the other end portions 14a thereof are again bent substantially perpendicular with respect to the surface 8c so as to extend in a direction towards the outside surface 8d while extending along the outside surfaces 8e, 8f. A middle electrode 3a located between the outermost electrodes 3a can include a tip end portion 14a that terminates at an edge portion of bottom surface 8c, if desired.

In the above-described eleventh exemplary embodiment, structures other than those described immediately above can be the same or similar to those described with respect to the ninth exemplary embodiment.

A twelfth exemplary embodiment of the disclosed subject matter will now be described with reference to FIGS. 13(a)-(d). FIGS. 13(a)-(d) show a front view, a top view, a side view and a bottom view of a semiconductor optical device made in accordance with the twelfth exemplary embodiment.

Differences between the twelfth exemplary embodiment and the ninth exemplary embodiment can include different layouts for the semiconductor optical chips 4.

Specifically, both of the outside one end portions 7a, 7b among the three adjacent one end portions 7a, 7b can be the same as in the ninth exemplary embodiment. However each of the middle one end portions 7a, 7b can be exchanged. Thus, two semiconductor optical chips can be disposed on the pair of outermost one end portions 7a and one semiconductor chip can be disposed on a middle upper one end portion 7a.

In the above-described twelfth exemplary embodiment, structures other than those described immediately above can be the same or similar to those with respect to the ninth exemplary embodiment. The structure shown in the twelfth exemplary embodiment can especially be useful for using semiconductor optical chips that emit respective different light-emitting colors. For instance, the middle one end portion 7a can include an LED disposed thereon that has a small self-fever such as a red LED and each of the pair of outermost one end portions 7a can have blue LED and/or green LEDs mounted thereon. The structure can provide semiconductor optical devices that can maintain miniaturization while providing a high radiating efficiency, and can also perform excellent color rendering.

A thirteenth exemplary embodiment of the disclosed subject matter will now be described with reference to FIGS. 14(a)-(d). FIGS. 14(a)-(d) show a front view, a top view, a side view and a bottom view of a semiconductor optical device made in accordance with the thirteenth exemplary embodiment.

Differences between the thirteenth exemplary embodiment and the tenth exemplary embodiment can include different layouts for the semiconductor optical chips 4.

Specifically, both of the outermost one end portions 7a, 7b among the three adjacent one end portions 7a, 7b can be the same as in the tenth exemplary embodiment. However, the middle one end portions 7a, 7b can be exchanged (as compared to the tenth exemplary embodiment). Thus, two semiconductor optical chips can be disposed on the pair of outermost one end portions 7a and one semiconductor chip can be disposed on the middle upper one end portion 7a.

In the above-described thirteenth exemplary embodiment, structures other than those described above can be the same or similar to those disclosed with respect to the tenth exemplary embodiment.

The above-described exemplary embodiments with reference to FIGS. 1-14 are examples of semiconductor optical devices that are constructed in accordance with the principles of the presently disclosed subject matter. The common structure and effect in at least one of the above exemplary embodiments will now be given in detail.

Sd' defines an area of contact portions Sd (for example, contact portions of the end portions 14a that is/are disposed on the outside surfaces 8c, 8c', etc.) wherein the contact portions Sd are those portions of the other end portions 14a of the lead frame electrodes 3a that contact the conductor patterns of a circuit board. Sw' defines an area of contact portions Sw (for example, contact area portions of the end portions

14b that is/are disposed on the outside surfaces 8c, 8c', etc.) wherein the contact portions Sw are those portions of end portions 14b of the lead frame electrodes 3b that contact conductor patterns of a circuit board. Some disclosed relations between Sd' and Sw' are as follows.

A typical relation of the disclosed subject matter can be (Sd'>Sw'). Another relation can be (Sd'>2×Sw') and still another relation can be (Sd'>5×Sw').

Sd and Sw are contact portions that contact conductor patterns of a circuit board through an electric connective material such as a solder and the like when mounting a semiconductor optical device 1 on a circuit board. Thus, if the area Sw' of the contact portions Sw is/are constant, the greater the area Sd' of the contact portions Sd, the greater the efficiency for conducting the self-fever of semiconductor optical chips 4 to the conductor patterns. The semiconductor optical device 1 can be sure to effect a great radiation.

Figure 16:
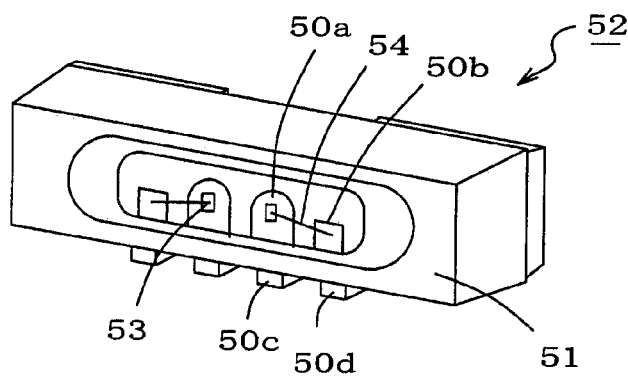
FIG. 16 is a perspective view depicting a conventional semiconductor optical device.

When the semiconductor optical device 1 is mounted on a circuit board, Sn defines a whole area of the semiconductor optical device 1 that faces a circuit board. Sd" defines one contact portion of one other end portion 14a out of the contact portions Sd. The Sd" in a conventional semiconductor optical device, in which all lead frame electrodes are led from a mounting surface to an outside as shown in FIG. 16 accounts for less than 10 percent of Sn. If the number of lead frame electrodes increases along with an incremental increase in the number of optical chips in a semiconductor optical device 1, the proportion Sd" becomes less. However, the proportion Sd" with respect to Sn can be at least from 20 percent to 30 percent in accordance with the disclosed subject matter. That is, the proportion of Sd" for effecting great radiation characteristics can be more than two times as that of a conventional semiconductor optical device. Furthermore, when structures of the disclosed subject matter are compared with those of a conventional optical device, in which the same number of lead frame electrodes extend from a casing, the greater the lead frame electrode number, the more the proportion of Sd" can improve with respect to the presently disclosed subject matter.

The contact portions Sd that are in contact with conductor patterns of a circuit board can also increase in the disclosed subject matter. Therefore, the disclosed subject matter can maintain a high mounting reliability in order to mount a semiconductor optical device with confidence and strength.

Further more, the proportion of (Sd'+Sw') with respect to Sn can be more than 30 percent for the first exemplary embodiment to the thirteenth exemplary embodiment, and can be more than 40 percent for the 8th exemplary embodiment to the thirteenth exemplary embodiment. Because Sn is an occupation area on a circuit board when mounting the semiconductor optical device on the circuit board, a high proportion of (Sd'+Sw') with respect to Sn can result in an increment of contact portions (Sd+Sw) on conductor patterns of a circuit board.

Thus, the disclosed subject matter can effect a high radiation efficiency and a high mounting reliability.

When the semiconductor optical device of the disclosed subject matter is mounted on a circuit board, the other end portions 14a can be configured in a substantially similar shape, having the same area and located at the same level The device can be disposed on conductor patters that are located on a same level (for example, co-planar) in accordance with a layout of the other end portions 14a, which can be electrically connected to conductor patterns of circuit board through an electric connective material such as a solder and the like.

Similarly, when the semiconductor optical device of the disclosed subject matter is mounted on a circuit board, each of the other end portions 14b can be configured with substantially the same shape, same area and at a same level. The device can be configured to be disposed on conductor patters that are located at the same level in accordance with a layout of the other end portions 14b, which can be electrically connected to conductor patterns of a circuit board through an electric connective material such as a solder and the like.

Figure 15:
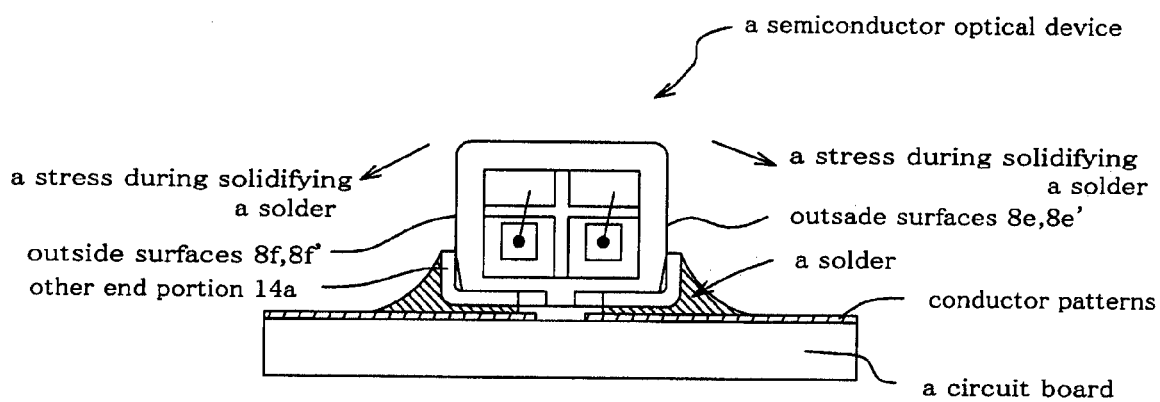
FIG. 15 is a front view showing the semiconductor optical device of FIGS. 1(a)-(d) mounted on a circuit board.

When the other end portions 14a of the semiconductor optical device 1 are connected to conductor patterns of a circuit board through a solder as shown in FIG. 15, the semiconductor optical device 1 is stressed in the direction of the other end portions 14a, as shown by arrows, during solidifying of a solder. If each of the other end portions 14a is formed to have substantially the same shape, same area and to be located at the same level, and is/are disposed on conductor patters located at the same level, the semiconductor optical device 1 can be mounted on the conductor patterns in a predetermined position with strength, confidence and good repetition ability due to the application of similar stress to each side of the device.

Similarly, when the other end portions 14b of the semiconductor optical device are also connected to conductor patterns of a circuit board through a solder, the above-described operation can be carried out.

On the other hand, when each of the other end portions 14a are not configured to have substantially the same shape and/or substantially the same area, each side may realize different stresses because of a different quantity of solder that may be adhered between each of the other end portions 14a and conductor patterns of the circuit board. As the result, the semiconductor optical device 1 may be mounted on a circuit board in an inclined pose that is called a Manhattan phenomenon.

When each of the other end portions 14a are also not disposed on conductor patterns that are at the same level in accordance with a layout of the end portions 14a, the semiconductor optical device 1 may not be situated perpendicular to the circuit board due to unequal stresses that may be present at each side.

The above-described characteristics, problems, and phenomena may be also caused in the other end portions 14b.

The two lead frame electrodes 3a in the first and sixth exemplary embodiments can be configured as follows: each of the one end portions 7a that include semiconductor optical chips 4 thereon extend into the casing 2; the electrodes 3a then extend from the outside surface 8c' to an area outside the casing 2; the electrodes 3a can then be bent substantially perpendicular with respect to the back surface 8b and in a direction towards the opening 5 while extending along the outside surface 8c; and the electrodes 3a terminating in a state that is not bent again, but simply provides a flat surface (other end portions 14a) resting along surface 8c of the casing 2.

Consequently, when the semiconductor optical device 1 is mounted on a circuit board, a solder quantity can be small in order to decrease contact areas of the other end portions 14a that are connected to conductor patterns of the circuit board through a solder. Thus, a solder fillet can also be small. As the result, the Manhattan phenomenon can be prevented and high mounting reliability can be maintained.

The lead frame electrodes 3a in the second-fifth and seventh-thirteenth exemplary embodiments can be configured as follows: the electrodes 3a can include one end portions 7a that include at least one semiconductor optical chips 4 mounted thereon and which reside in the casing 2; the end portions 7a extend into and through the casing 2 an emerge front the outside surface 8c' of the casing 2; the electrodes 3a can then be bent substantially perpendicular at the exit from the outside surface 8c'; and again can be bent substantially perpendicular with respect to and towards the direction of the outside surface 8d or 8d'.

As the result, when the semiconductor optical device is mounted on a circuit board, the semiconductor optical device 1 can be mounted on a circuit board with strength and confidence due to the increase in contact areas of the other end portions 14a that are connected to conductor patterns through a solder, which can also improve a solder affinity.

The lead frame electrodes 3b in the first-third and fifth-thirteenth exemplary embodiments can be configured as follows: each of the one end portions 7b that are connected to bonding wires 13 can be exposed in the casing 2; the electrodes 3b can then extend into the casing 2 and emerge therefrom at an area outside of the casing 2; and each of other end portions 14b can be disposed substantially parallel to the outside surface 8c, 8c' and/or 8d'.

Consequently, when the semiconductor optical device 1 is mounted on a circuit board, the semiconductor optical device 1 can be mounted on a circuit board with strength and confidence due to increased contact areas of the other end portions 14b with connected conductor patterns through a solder, while also capable of exhibiting an improvement in solder affinity.

The sixth exemplary embodiment can include an additional merit in that a high flexibility exists for designing the shape and defining each area of other end portions 14b of the lead frame electrodes 7b.

If L1, L2 defines a vertical length of the concave-shaped cavity formation 10 of the casing 2 and a vertical length of the lead frame electrode layout portion 11 of the casing 2 in the perpendicular direction with respect to the bottom portion (surface) of the concave-shaped cavity 6 and on a border of the bottom portion, some relations between L1 and L2 can be described as follows.

One relation can be (L1>L2) in the first-fourth and sixth-thirteenth exemplary embodiments and can be (L1<L2) in the fifth exemplary embodiment.

When L1 is longer than L2 in the first-fourth and sixth-thirteenth exemplary embodiments, the lead frame electrodes 3a can include a large area Sd of the other end portions 14a thereof disposed along the outside surface 8c of the concave-shaped cavity formation 10. When L1 is shorter than L2 in the fifth exemplary embodiment, the lead frame electrodes 3a can include a large area Sd of the other end portions 14a disposed along the outside surface 8c' of the lead frame electrode layout portion 11. Thus, when the semiconductor optical device 1 is mounted on a circuit board, the semiconductor optical device 1 can maintain a high radiation efficiency and high mounting reliability by increasing the contact area Sd.

On the other hand, the lead frame electrodes 7b in the first-fourth and sixth-thirteenth exemplary embodiments can include a small area Sw for the other end portions 14b thereof disposed along the outside surface 8c' of the lead frame electrode layout portion 11. The lead frame electrodes 7b in the fifth exemplary embodiment can also include a small area Sw for the other end portions 14b disposed along the outside surface 8c of the concave-shaped cavity formation 10.

Thus, when the semiconductor optical device 1 is mounted on a circuit board, a solder quantity that is adhered to the other end portions 14b can be minimized by decreasing the contact areas between Sw and the conductor patterns of a circuit board. Because a solder fillet (solders of both outside portions on left/right outside surfaces of electrodes) can also be minimized, the Manhattan phenomenon can be prevented and the mounting reliability can be maintained or improved.

When the semiconductor optical device 1 is mounted on a circuit board in the first-thirteenth exemplary embodiments, the bottom portion of the concave-shaped cavity 6 in which the semiconductor optical chips 4 are mounted can be substantially perpendicular to the circuit board. That is, because the optical axis of the semiconductor optical chips 4 is substantially parallel to the circuit board, a semiconductor optical device 1 of the side view type can be completed.

When the semiconductor optical device is mounted on a circuit board in the first-thirteenth exemplary embodiments, the lead frame electrodes 3a can extend from the outside surface 8c' to an area outside the casing 2, and each of the other end portions 14a thereof can be connected to the circuit board.

Thus, a thermal resistance of the lead frame electrodes 3a can be small due to a very short distance from each of the one end portions 7a to each of other end portions 14a, and the self-fevers of the semiconductor optical chips 4 mounted on each of the one end portions 7a can be efficiently conducted to the conductor patterns of the circuit board. Thus, the semiconductor optical device 1 can include excellent radiation efficiency.

In the first-thirteenth exemplary embodiments, each of the lead frame electrodes 3a, 3b can extend from respective different outside surfaces to areas outside of the casing 2, and each of the one end portions 7a, 7b can include at least one of semiconductor optical chip(s) 4 or bonding wire(s) 13 attached thereto.

Thus, because each of the other end portions 14a, 14b can be effectively disposed at the outside surfaces 8c, 8c' that serve as mounting surfaces of the semiconductor optical device 1, the semiconductor optical device 1 can exhibit a miniaturization characteristic while also maintaining a high radiation efficiency and a high mounting reliability.

In the first-thirteenth exemplary embodiments, a connecting method between the other end portions 14a, 14b and conductor patterns of a circuit board should not be limited to soldering. Rather, attachment can be carried out by other methods such though the use of a thermal sheet pressure, and the like.

In the first-thirteenth exemplary embodiments, a bending method for the lead frame electrodes 3a, 3b can be carried out through the use of a forming process. However, other methods and manners for obtaining the final structures for the electrodes 3a and 3b can be used without departing from the spirit and scope of the presently disclosed subject matter.

The semiconductor optical devices of the disclosed subject matter can include: at least one first lead frame electrode that is fixed within a casing that is formed in a substantially cuboid shape and which casing includes a resin material. One end portion of the first lead can be exposed on a bottom portion in the concaved-shaped cavity of the casing, and other end portion thereof can extend from the casing to the outside and be bent substantially perpendicular at the outside surface. At least one semiconductor optical chip can be mounted on the one end portion of the first electrode. As a result, a tip part of the other end portion of the first electrode that is bent at and along the outside surface can exhibit a large area.

The above-described tip part can be a soldering contact portion for connection to conductor patterns of the circuit board when the semiconductor optical device is mounted on the circuit board. Thus, the semiconductor optical device can improve the efficiency for conducting self-fever of the semiconductor optical chip to conductor patterns of the circuit board and can include an excellent radiant efficiency. At the same time, the semiconductor optical device can provide improvement in mounting reliability such that the device can be mounted on the circuit board with strength, confidence and good repetitiveness.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A semiconductor optical device comprising:
   a casing having a concave-shaped cavity with an opening and a bottom portion;
   at least one first lead frame electrode with one end portion exposed at the bottom portion of the casing, the at least one first lead frame electrode extending from the bottom portion of the casing and onto an outside surface of the casing that is substantially perpendicular to the bottom portion, and the at least one first lead frame electrode being bent substantially perpendicularly at the outside surface in a direction towards the opening and including an other end portion located on an outside surface of the casing;
   at least one second lead frame electrode having one end portion exposed at the bottom portion of the casing, the at least one second lead frame electrode extending from the bottom portion of the casing and onto a respective outside surface of the casing that is at least one of, opposite to and perpendicular to, the outside surface from which the at least one first lead frame electrode extends, the at least one second lead frame electrode being bent substantially perpendicularly at the respective outside surface in a direction away from the opening in the casing and including an other end portion that includes an outer surface that is substantially coplanar with an outer surface of the other end portion of the at least one first lead frame electrode; and
   at least one semiconductor optical chip being mounted on the one end portion of the at least one first lead frame electrode, one electrode of the at least one semiconductor optical chip being electrically connected to the one end portion of the at least one first lead frame electrode, and an other electrode of the at least one semiconductor optical chip being electrically connected to the one end portion of the at least one second lead frame electrode.

2. The semiconductor optical device according to claim 1, wherein the at least one second lead frame electrode is further bent substantially perpendicularly and in one of a direction towards the other end portion of the at least one first lead frame electrode and a direction away from the other end portion of the at least one first lead frame electrode.

3. The semiconductor optical device according to claim 2, wherein the at least one first lead frame electrode further extends onto an other outside surface of the casing in a substantially perpendicular direction with respect to the outside surface of the casing that is substantially perpendicular to the bottom portion and upon which the at least one first lead frame electrode initially extends.

4. The semiconductor optical device according to claim 3, further comprising a plurality of first lead frame electrodes, wherein each of the first lead frame electrodes is bent in a direction away from each adjacent first lead frame.

5. The semiconductor optical device according to claim 4, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

6. The semiconductor optical device according to claim 3, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

7. The semiconductor optical device according to claim 2, further comprising a plurality of first lead frame electrodes, wherein each of the first lead frame electrodes is bent in a direction away from each adjacent first lead frame electrode.

8. The semiconductor optical device according to claim 7, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

9. The semiconductor optical device according to claim 2, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

10. The semiconductor optical device according to claim 1, wherein the at least one first lead frame electrode further extends onto an other outside surface of the casing in a substantially perpendicular direction with respect to the outside surface of the casing that is substantially perpendicular to the bottom portion and upon which the at least one first lead frame electrode initially extends.

11. The semiconductor optical device according to claim 10, further comprising a plurality of first lead frame electrodes, wherein each of the first lead frame electrodes is bent in a direction away from each adjacent first lead frame electrode.

12. The semiconductor optical device according to claim 11, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

13. The semiconductor optical device according to claim 10, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

14. The semiconductor optical device according to claim 1, further comprising a plurality of first lead frame electrodes, wherein each of the first lead frame electrodes is bent in a direction away from each adjacent first lead frame electrode.

15. The semiconductor optical device according to claim 14, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

16. The semiconductor optical device according to claim 1, further comprising an encapsulating resin including at least one of a transparent resin and a mixture resin, the mixture resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

17. The semiconductor optical device according to claim 1, wherein the casing is configured in a substantial cuboid shape and includes a resin.

18. A semiconductor optical device comprising:
a casing having a concave-shaped cavity with an opening and a bottom portion;
at least one first lead frame electrode with one end portion exposed at the bottom portion of the casing, the at least one first lead frame electrode extending from the one end portion onto an outside surface of the casing that is substantially perpendicular to the bottom portion, and the at least one first lead frame electrode being bent substantially perpendicularly at the outside surface in a direction away from the opening of the casing and including an other end located on an outside surface of the casing;
at least one second lead frame electrode having one end portion exposed at the bottom portion of the casing, the at least one second lead frame electrode extending from the bottom portion of the casing and onto a respective outside surface of the casing that is at least one of, opposite to and perpendicular to, the outside surface from which the at least one first lead frame electrode extends, the at least one second lead frame electrode being bent substantially perpendicularly at the respective outside surface in a direction towards the opening in the casing and including an other end portion that includes an outer surface that is substantially coplanar with an outer surface of the other end portion of the at least one first lead frame electrode; and
at least one semiconductor optical chip being mounted on the one end portion of the at least one first lead frame electrode, one electrode of the at least one semiconductor optical chip being electrically connected to the one end portion of the at least one first lead frame electrode, and an other electrode of the at least one semiconductor optical chip being electrically connected to the one end portion of the at least one second lead frame electrode.

19. The semiconductor optical device according to claim 18, wherein the at least one second lead frame electrode is further bent substantially perpendicularly and onto the outside surface of the casing upon which the at least one first lead frame electrode extends.

20. The semiconductor optical device according to claim 19, wherein the at least one first lead frame electrode further extends to an other outside surface of the casing in a substantially perpendicular direction with respect to the outside surface of the casing that is substantially perpendicular to the bottom portion and upon which the at least one first lead frame electrode initially extends.

21. The semiconductor optical device according to claim 20, further comprising a plurality of first lead frame electrodes, wherein each of the first lead frame electrodes is bent in a direction away from each adjacent first lead frame electrode.

22. The semiconductor optical device according to claim 21, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

23. The semiconductor optical device according to claim 20, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

24. The semiconductor optical device according to claim 19, further comprising a plurality of first lead frame electrodes, wherein each of the first lead frame electrodes is bent in a direction away from each adjacent first lead frame electrode.

25. The semiconductor optical device according to claim 24, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

26. The semiconductor optical device according to claim 19, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

27. The semiconductor optical device according to claim 18, wherein the at least one first lead frame electrode further extends onto an other outside surface of the casing in a substantially perpendicular direction with respect to the outside surface of the casing that is substantially perpendicular to the bottom portion and upon which the at least one first lead frame electrode initially extends.

28. The semiconductor optical device according to claim 27, further comprising a plurality of first lead frame electrodes, wherein each of the first lead frame electrodes is bent in a direction away from each adjacent first lead frame electrode.

29. The semiconductor optical device according to claim 28, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

30. The semiconductor optical device according to claim 27, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

31. The semiconductor optical device according to claim 18, further comprising a plurality of first lead frame electrodes, wherein each of the first lead frame electrodes is bent in a direction away from each adjacent first lead frame electrode.

32. The semiconductor optical device according to claim 31, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

33. The semiconductor optical device according to claim 18, further comprising an encapsulating resin including at least one of a transparent resin and a mixture resin, the mixing resin including a resin mixed with at least one of a diffuser, a phosphor, and a pigment for selectively absorbing light having a predetermined wavelength, the encapsulating resin being disposed in the concave-shaped cavity and encapsulating the at least one semiconductor optical chip.

34. The semiconductor optical device according to claim 18, wherein the casing is configured in a substantial cuboid shape and includes a resin.

* * * * *